United States Patent
Iwata et al.

(10) Patent No.: US 9,182,631 B2
(45) Date of Patent: Nov. 10, 2015

(54) PHOSPHOR SUBSTRATE, DISPLAY DEVICE, AND ELECTRONIC APPARATUS

(75) Inventors: Akiko Iwata, Osaka (JP); Mitsuhiro Koden, Osaka (JP); Yuhki Kobayashi, Osaka (JP); Hisanori Bessho, Osaka (JP); Satoshi Shibata, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 19 days.

(21) Appl. No.: 14/236,896

(22) PCT Filed: Aug. 3, 2012

(86) PCT No.: PCT/JP2012/069836
§ 371 (c)(1),
(2), (4) Date: Feb. 3, 2014

(87) PCT Pub. No.: WO2013/021941
PCT Pub. Date: Feb. 14, 2013

(65) Prior Publication Data
US 2014/0168572 A1    Jun. 19, 2014

(30) Foreign Application Priority Data
Aug. 5, 2011   (JP) ................. 2011-171767

(51) Int. Cl.
| | | |
|---|---|---|
| *G02F 1/1335* | (2006.01) | |
| *H01L 51/52* | (2006.01) | |
| *H05B 33/10* | (2006.01) | |
| *H05B 33/14* | (2006.01) | |
| *F21K 99/00* | (2010.01) | |

(52) U.S. Cl.
CPC ............ *G02F 1/133621* (2013.01); *F21K 9/56* (2013.01); *H01L 51/5268* (2013.01); *H01L 51/5284* (2013.01); *H05B 33/10* (2013.01); *H05B 33/14* (2013.01); *G02F 1/133617* (2013.01); *G02F 2001/133614* (2013.01)

(58) Field of Classification Search
CPC ................... H01L 2924/00; H01L 2924/0002; H01L 21/6715; H01L 25/167; H01L 25/0753; H01L 27/3246; H01L 2933/0091; H01L 33/24; H01L 33/38; H01L 33/385; H01L 33/46; H01L 33/50; H01L 33/504; H01L 33/0079
USPC .................................. 313/498–512
See application file for complete search history.

(56) References Cited

U.S. PATENT DOCUMENTS

| | | |
|---|---|---|
| 5,126,214 A | 6/1992 | Tokailin et al. |
| 6,469,755 B1 | 10/2002 | Adachi et al. |
| 2008/0036367 A1 | 2/2008 | Eida et al. |
| 2012/0194764 A1 | 8/2012 | Ishizumi |

FOREIGN PATENT DOCUMENTS

| | | |
|---|---|---|
| JP | A-62-194227 | 8/1987 |
| JP | A-03-152897 | 6/1991 |
| JP | A-07-043699 | 2/1995 |
| JP | A-11-329726 | 11/1999 |
| JP | A-2000-076979 | 3/2000 |
| JP | A-2000-131683 | 5/2000 |
| JP | A-2001-027802 | 1/2001 |
| JP | A-2010-215688 | 9/2010 |
| WO | WO 2006/022123 A1 | 3/2006 |
| WO | WO 2011/058780 A1 | 5/2011 |

*Primary Examiner* — Mariceli Santiago
*Assistant Examiner* — Brenitra M Lee
(74) *Attorney, Agent, or Firm* — Morrison & Foerster LLP

(57) ABSTRACT

A phosphor substrate (10) includes a substrate (1), phosphor layers (3R, 3G, and 3B) which are disposed on the substrate (1) and which emit fluorescences (L2) using incident excitation light (L1), and a partition (7) surrounding side faces of the phosphor layers (3R, 3G, and 3B), in which at least portions of the partition (7) in contact with the phosphor layers (3R, 3G, and 3B) have light-scattering properties.

20 Claims, 21 Drawing Sheets

PHOSPHOR SUBSTRATE, DISPLAY DEVICE, AND ELECTRONIC APPARATUS

CROSS REFERENCE TO RELATED APPLICATIONS

This is a U.S. National Phase patent application of PCT/JP2012/069836, filed Aug. 3, 2012, which claims priority to Japanese patent application no. JP 2011-171767, filed Aug. 5, 2011, each of which is hereby incorporated by reference in the present disclosure in its entirety.

TECHNICAL FIELD

The present invention relates to a phosphor substrate, a display device, and an electronic apparatus.

BACKGROUND ART

In recent years, displays mounted on television sets, personal computers, information terminal assistants, and so forth have been increasingly required to have higher performance. There have been advances in the research and development of various types of display devices, such as cathode ray tube displays, liquid crystals, plasma displays (PDPs), and organic EL displays. In particular, liquid crystal displays are thin and light in weight and thus compose the major portion of a current display market. However, liquid crystal displays have narrow viewing angles and low image recognition performance when viewed from an oblique direction, compared with conventional cathode ray tube displays.

As a method for improving viewing angle characteristics of a liquid crystal display device, a method is disclosed in which phosphors and scattering members are arranged on the front of a liquid crystal display device, a part of blue light from a polarized collimated light source is used for blue display, and a part of the blue light is color-converted into red and green with the phosphors, thereby performing display (for example, see PTLs 1 and 2).

Organic EL displays are display devices having excellent display characteristics, such as high contrast, wide viewing angles, and high-speed response. To achieve full-color display, RGB light-emitting layers are required to be patterned by mask deposition, thus causing difficulty in increasing the definition and the size.

Meanwhile, a method for emitting light from RGB phosphors using a monochromatic organic EL as an excitation light source is disclosed (for example, see PTL 3).

In a phosphor color conversion display, in the case where a black matrix is disposed, light emitted from phosphors is absorbed or confined in the matrix, so that the light-output efficiency is not increased.

In contrast, a method is reported in which a white paste is used for a partition of a PDP (for example, see PTL 4).

Regarding other conventional techniques, in a phosphor color conversion display including an organic EL element serving as an excitation light source, a structure is reported in which a reflective film is disposed on a side face of a phosphor layer (for example, see PTL 5).

CITATION LIST

Patent Literature

PTL 1: Japanese Unexamined Patent Application Publication No. 2000-131683

PTL 2: Japanese Unexamined Patent Application Publication No. 62-194227

PTL 3: Japanese Unexamined Patent Application Publication No. 3-152897

PTL 4: Japanese Unexamined Patent Application Publication No. 2010-215688

PTL 5: Japanese Unexamined Patent Application Publication No. 11-329726

SUMMARY OF INVENTION

Technical Problem

A phosphor substrate described in PTL 1 includes a black matrix between phosphor layers and color filters corresponding to different pixels. Thus, fluorescences emitted from the phosphor layers are absorbed by the black matrix, thereby failing to sufficiently output the fluorescences to the outside.

An aspect of the present invention has been accomplished in order to solve the foregoing problems and aims to provide a phosphor substrate capable of sufficiently outputting fluorescence generated in a phosphor layer to the outside, a display device, and an electronic apparatus.

Solution to Problem

According to an aspect of the present invention, a phosphor substrate includes a substrate, a phosphor layer disposed on the substrate, the phosphor layer emitting fluorescence using incident excitation light, and a partition surrounding side faces of the phosphor layer, in which at least a portion of the partition in contact with the phosphor layer has light-scattering properties.

In the phosphor substrate according to the aspect of the present invention, at least the portion of the partition in contact with the phosphor layer may be composed of a material containing a resin and light-scattering particles.

In the phosphor substrate according to the aspect of the present invention, at least the portion of the partition in contact with the phosphor layer may be white.

In the phosphor substrate according to the aspect of the present invention, at least the portion of the partition in contact with the phosphor layer may have an uneven shape.

According to another aspect of the present invention, a display device includes the foregoing phosphor substrate and a light source configured to emit excitation light with which the phosphor layer is irradiated.

In the display device according to the another aspect of the present invention, a plurality of pixels may be provided and may at least include a red pixel configured to perform display with red light, a green pixel configured to perform display with green light, and a blue pixel configured to perform display with blue light, ultraviolet light serving as the excitation light may be emitted from the light source, and the phosphor layer may include a red phosphor layer disposed as the red pixel, the red phosphor layer being configured to emit red light using the ultraviolet light as the excitation light, a green phosphor layer disposed as the green pixel, the green phosphor layer being configured to emit green light using the ultraviolet light as the excitation light, and a blue phosphor layer disposed as the blue pixel, the blue phosphor layer being configured to emit blue light using the ultraviolet light as the excitation light.

In the display device according to the another aspect of the present invention, a plurality of pixels may be provided and may at least include a red pixel configured to perform display with red light, a green pixel configured to perform display with green light, and a blue pixel configured to perform display with blue light, blue light serving as the excitation light may be emitted from the light source, the phosphor layer may include a red phosphor layer disposed as the red pixel, the red phosphor layer being configured to emit red light using the blue light as the excitation light, and a green phosphor layer disposed as the green pixel, the green phosphor layer being configured to emit green light using the blue light as the excitation light, and a scattering layer serving as the blue pixel, the scattering layer being configured to scatter the blue light.

In the display device according to the another aspect of the present invention, the light source may be an active matrix addressed light source, the active matrix addressed light source including a plurality of light-emitting elements disposed in response to the plurality of pixels and a plurality of driving elements configured to drive the respective plurality of light-emitting elements.

In the display device according to the another aspect of the present invention, the light source may include any one of a light-emitting diode, an organic electroluminescent element, and an inorganic electroluminescent element.

In the display device according to the another aspect of the present invention, the light source may be a planar light source configured to emit light from a light-emitting surface, and a liquid crystal element may be disposed between the planar light source and the phosphor substrate, the liquid crystal element being configured to control a transmittance of light emitted from the planar light source for each pixel.

In the display device according to the another aspect of the present invention, the light source may have directivity.

In the display device according to the another aspect of the present invention, a polarizer may be disposed between the light source and the phosphor substrate, the polarizer having an extinction ratio of 10,000 or more at a wavelength of 435 nm or more and 480 nm or less.

In the display device according to the another aspect of the present invention, a color filter may be disposed on any one of a top face and a bottom face of the phosphor layer.

In the display device according to the another aspect of the present invention, a black layer may be disposed on at least one of a top face and a bottom face of the partition.

In the display device according to the another aspect of the present invention, a band pass filter may be disposed between the light source and the phosphor substrate, the band pass filter transmitting light in a blue region and reflecting light in a green to near-infrared region.

According to still another aspect of the present invention, an electronic apparatus includes the foregoing display device according to the present invention.

Advantageous Effects of Invention

According to aspects of the present invention, provided are a phosphor substrate capable of sufficiently outputting fluorescence emitted from a phosphor layer to the outside, a display device, and an electronic apparatus.

DESCRIPTION OF EMBODIMENTS

While aspects of the present invention will be described in more detail by embodiments and examples, the aspects of the present invention are not limited to these embodiments and examples.

In all drawings, components may be illustrated at different scales so as to be easily viewable.

[First Embodiment]

Figure 1:
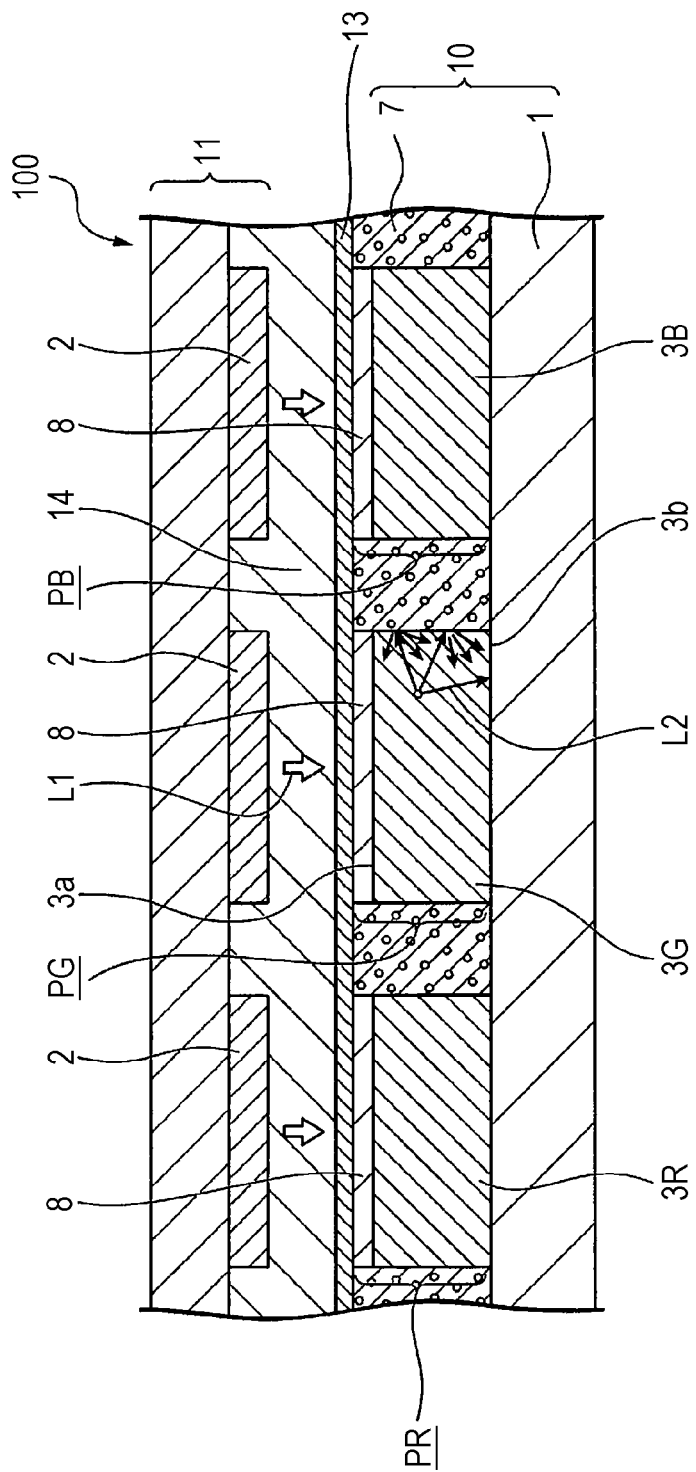
FIG. 1 is a schematic cross-sectional view of a display device according to a first embodiment of the present invention.

FIG. 1 is a schematic cross-sectional view of a display device 100 according to a first embodiment.

The display device 100 includes a phosphor substrate 10, a substrate 13, a light source 11, and an adhesive layer 14. The substrate 13 is provided between the phosphor substrate and the light source 11. The light source 11 includes light-emitting elements 2. Excitation light L1 to be incident on the phosphor substrate 10 is emitted from the light-emitting elements 2. The adhesive layer 14 bonds the light source 11 and the phosphor substrate 10. A common ultraviolet curable resin, a thermosetting resin, or the like may be used for the adhesive layer.

In the case where a light source is directly disposed on the phosphor substrate 10, the adhesive layer 14 may be arranged at a portion which is located at the periphery of the phosphor substrate 10 and the light source 11 and which is located between the phosphor substrate 10 and the light source 11, and a region surrounded by the adhesive layer 14 may be filled with an inert gas, for example, nitrogen gas or argon gas. The incorporation of a desiccant, such as barium oxide, in the inert gas with which the region has been filled is preferred because when an excitation light source is an organic EL light source, the effect of water on the organic EL can be more effectively reduced. However, this embodiment is not limited to these components or a formation method.

Figure 2:
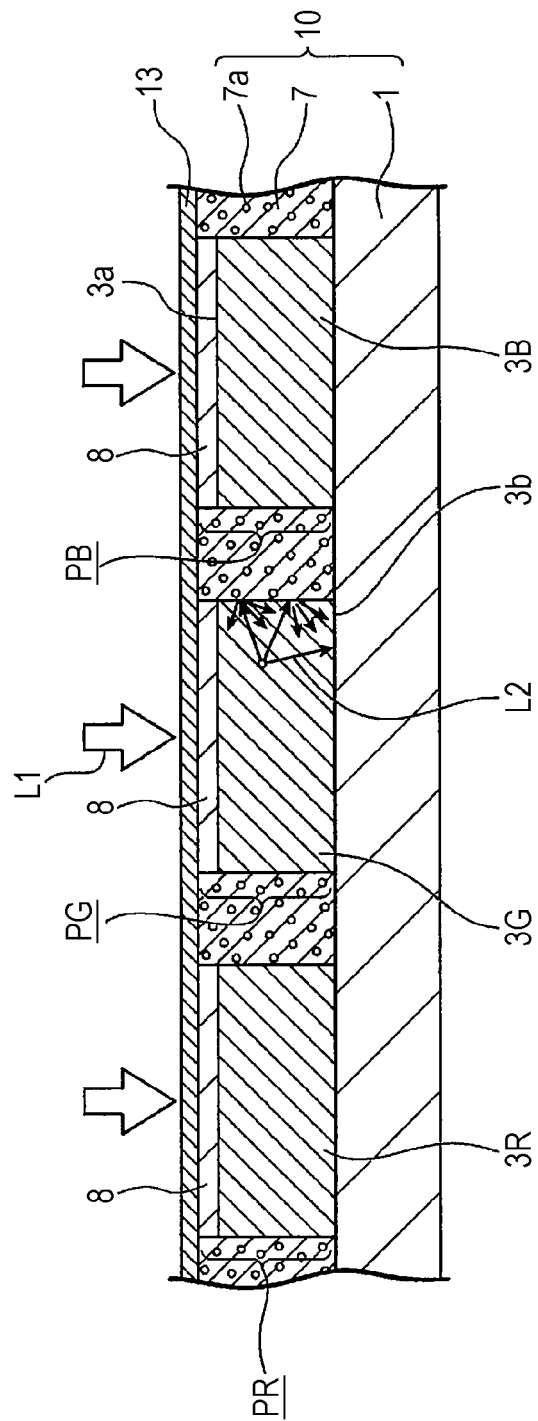
FIG. 2 is a schematic cross-sectional view of a phosphor substrate according to the first embodiment of the present invention.

FIG. 2 is a schematic cross-sectional view of the phosphor substrate 10 according to the first embodiment.

In this embodiment, a substrate 10 is located opposite the phosphor substrate 10. In the phosphor substrate 10, a single pixel, which is a minimum unit configured to form an image, includes one of the three dots to display red, green, and blue colors. In the following description, a dot to display a red color is referred to as a "red pixel PR". A dot to display a green color is referred to as a "green pixel PG". A dot to display a blue color is referred to as a "blue pixel PB".

As the excitation light L1, for example, ultraviolet light or blue light is emitted from the outside of the substrate 13. When the phosphor substrate 10 receives the excitation light L1 emitted from the outside, a red fluorescence L2 is generated in the red pixel PR, a green fluorescence L2 is generated in the green pixel PG, and a blue fluorescence L2 is generated in the blue pixel PB. Full-color display is achieved by the light components of the three colors: red, green, and blue.

(Phosphor Substrate)

The phosphor substrate 10 according to this embodiment includes the substrate 1, phosphor layers 3R, 3G, and 3B, a partition 7, and planarizing layers 8. The phosphor layers 3R, 3G, and 3B are provided on the substrate 1. The phosphor layers 3R, 3G, and 3B receive the excitation light L1 incident from the outside of the substrate 13 located opposite the substrate 1 to generate the fluorescences L2. The partition 7 surrounds the side faces of the phosphor layers 3R, 3G, and 3B. The planarizing layers 8 are provided on surfaces of the phosphor layers 3R, 3G, and 3B.

Excitation light incident surfaces 3a of the phosphor layers 3R, 3G, and 3B on which the excitation light L1 is incident are exposed at opening portions of the partition 7. That is, the excitation light incident surfaces 3a are surfaces on which the excitation light L1 emitted from the light-emitting elements 2 of the light source 11 can be incident. The excitation light L1 is converted into the fluorescences L2 in the phosphor layers 3R, 3G, and 3B. The fluorescences L2 are emitted from emission surfaces 3b of the phosphor layers 3R, 3G, and 3B.

The phosphor layers 3R, 3G, and 3B may be formed of a plurality of phosphor layers divided for each dot. The plural phosphor layers 3R, 3G, and 3B are composed of different phosphor materials in order to emit light beams having different colors in response to the dots. The phosphor materials contained in the phosphor layers 3R, 3G, and 3B may have different refractive indices.

The phosphor layers 3R, 3G, and 3B are formed of, for example, rectangular thin films in plan view. Wavelength-selective transmitting and reflecting members configured to transmit the excitation light L1 and reflect the fluorescences L2 emitted from the phosphor layers 3R, 3G, and 3B may be disposed on the outer side of the excitation light incident surfaces 3a of the phosphor layers 3R, 3G, and 3B. The term "to transmit the excitation light" indicates that at least a light component having the peak wavelength of the excitation light is transmitted. The term "to reflect the fluorescences emitted from the phosphor layers 3R, 3G, and 3B" indicates that at least a light component having an emission peak wavelength emitted from each of the phosphor layers 3R, 3G, and 3B is reflected.

The partition 7 has light-scattering particles 7a dispersed therein. Specifically, the partition 7 is composed of a material containing a resin and the light-scattering particles. In this embodiment, the entire partition 7 is composed of the resin and the light-scattering particles. However, the partition 7 is not limited thereto. For example, only portions of the partition 7 in contact with the phosphor layers 3R, 3G, and 3B may be composed of the material containing the resin and the light-scattering particles. In other words, at least the portions of the partition 7 in contact with the phosphor layers 3R, 3G, and 3B may have light scattering properties.

The partition 7 may be white. Specifically, the partition 7 may contain a white resist. The entire partition 7 may contain the white resist. Alternatively, only the portions of the partition 7 in contact with the phosphor layers 3R, 3G, and 3B may contain the white resist. That is, at least the portions of the partition 7 in contact with the phosphor layers 3R, 3G, and 3B may be white. In this case, the fluorescences L2 is not easily absorbed by the partition 7, compared with the case of a black partition.

Figure 3A:
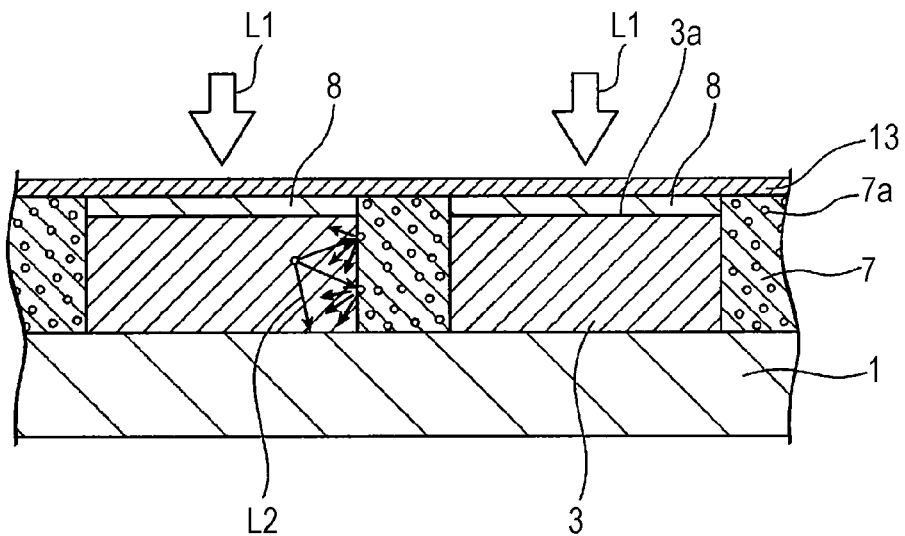
FIG. 3A is a schematic diagram illustrating the effect of a partition according to the first embodiment of the present invention.
Figure 3B:
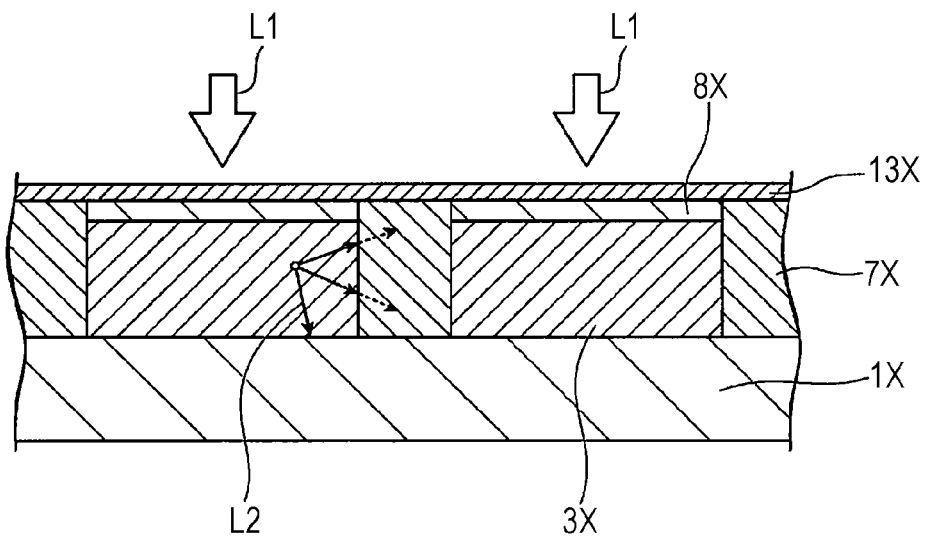
FIG. 3B is a schematic diagram illustrating the effect of a conventional partition.

FIGS. 3A and 3B are schematic diagrams illustrating the effect of the partition 7 of the display device 100 according to the first embodiment. FIG. 3A is a schematic cross-sectional view of the display device 100 according to this embodiment. FIG. 3B is a schematic cross-sectional view of a conventional display device 100X.

As illustrated in FIG. 3B, in the case where a black matrix 7X is disposed around phosphor layers 3X, when the excitation light L1 is incident on the phosphor layers 3X from the outside, the fluorescences L2 generated in the phosphor layer 3X are absorbed by the black matrix 7X, thereby failing to sufficiently outputting the fluorescences L2 to the outside (broken lines in FIG. 3B).

In contrast, in this embodiment as illustrated in FIG. 3A, the partition 7 surrounding the side faces of the phosphor layers 3 contains the light-scattering particles 7a dispersed therein. Thus, the fluorescences L2 generated in the phosphor layers 3 are scattered from the light-scattering particles 7a in the contact portions of the partition 7 and are not easily absorbed by the partition 7.

This results in a reduction in the loss of the fluorescences L2 generated in the phosphor layers 3 due to absorption by the partition 7, thus enabling the fluorescences L2 to be sufficiently output to the outside.

In this embodiment, the substrate 13 is provided, thus facilitating the production. For example, let us suppose that a structure includes an excitation light source disposed on the outer side of the substrate. For example, in the case where the excitation light source is an organic EL element and where the substrate 13 is absence, the phosphor layers, color filter layers, a partition layer, and so forth need to be stacked in that order after layers of the organic EL element are stacked. Alternatively, a substrate in which the formation has proceeded to a cathode of the organic EL element and a phosphor substrate in which a partition layer, a color filter layer, and the phosphor layers have been formed on another substrate need to be bonded together in an atmosphere free from water or oxygen. In this case, it is very difficult to perform the production. Furthermore, for example, in the case where the excitation light source is formed of an LED and where the transmission of light is controlled by a liquid-crystal element, the presence of the substrate enables a liquid-crystal substrate and the phosphor substrate to be separately produced, thus easily performing the production at low cost.

The arrangement of the substrate 13 on the display device indicates a high effect of sealing and protecting an organic EL element. Organic EL elements are liable to be degraded by the effect of water and oxygen. A structure sealed by two substrates, the substrate 13 and the substrate 1, can reduce the occurrence of the entrance of water and oxygen in air into the organic EL element, compared with a structure sealed only by the substrate 1. This prevents the degradation of the organic EL element to increase the reliability. Furthermore, the arrangement of the substrate 13 separates the organic EL element from other components, such as the partition that possibly contains residual water, the phosphors that possibly contains a residual organic solvent, and a color filter, after a development process. This enables the organic EL element to have a long lifetime, compared with the case where the substrate 13 is not provided.

In the case where the distance between the light source and the phosphor is short, the phosphor is liable to be degraded by heat generated from the light source. In contrast, in the case where the excitation light source is arranged at the outer side of the substrate 13, the distance between the light source and the phosphor is sufficiently ensured, thereby inhibiting the degradation of the phosphor due to the heat from the excitation light source.

While the components of the phosphor substrate 10 according to this embodiment and a method for producing the phosphor substrate 10 will be specifically described below, the components of the phosphor substrate 10 and the method for producing the phosphor substrate 10 are not limited thereto.

[Substrate]

The substrate 1 used for the phosphor substrate 10 in this embodiment needs to transmit the fluorescences L2 in emission regions for the phosphor layers 3R, 3G, and 3B because the fluorescences L2 from the phosphor layers 3R, 3G, and 3B need to be output to the outside. Examples of the phosphor substrate 10 include inorganic material substrates composed of, for example, glass and silica; and plastic substrates composed of, for example, polyethylene terephthalate, polycarbazole, and polyimide. This embodiment, however, is not limited to these substrates.

[Phosphor Layer]

The phosphor layers 3R, 3G, and 3B according to this embodiment include a red phosphor layer 3R, a green phosphor layer 3G, and a blue phosphor layer 3B which absorb the excitation light L1 from the light-emitting elements 2, such as ultraviolet-emitting organic EL elements, blue-light-emitting organic EL elements, ultraviolet LEDs, or blue LEDs, and which emit red light, green light, and blue light. However, in the case where the light-emitting elements 2 that emit blue light are used, the blue excitation light L1 may be used as light emitted from the blue pixel PB without arranging the blue phosphor layer 3B. In the case where the light-emitting elements 2 that emit directional blue light beams are used, light-scattering layers that scatter the directional excitation light L1 to produce an isotropic emission to be output to the outside may be used without arranging the blue phosphor layer 3B.

Furthermore, phosphor layers configured to emit cyan light and yellow light are preferably added as pixels, if necessary. Here, color purities of the pixels configured to emit cyan light and yellow light are set so as to be located outside a triangle formed by the connection of positions of the color purities of the pixels configured to emit red, green, and blue light on a chromaticity diagram. Thus, a color reproduction range can be extended, compared with a display device including pixels configured to emit three primary colors of red, green, and blue.

The phosphor layers 3R, 3G, and 3B may be composed of only phosphor materials illustrated below and may optionally contain an additive and so forth. These materials may be dispersed in a polymeric material (binder resin) or an inorganic material.

Known phosphor materials may be used as phosphor materials according to this embodiment. These phosphor materials are divided into organic phosphor materials and inorganic phosphor materials. While specific compounds thereof are illustrated below, the phosphor materials are not limited to these materials.

Regarding the organic phosphor materials, examples of blue fluorescent dyes include stilbene dyes, such as 1,4-bis(2-methylstyryl)benzene and trans-4,4'-diphenylstilbene; and coumarin dyes, such as 7-hydroxy-4-methylcoumarin, ethyl 2,3,6,7-tetrahydro-11-oxo-1H,5H,11H-[1]benzopyrano[6,7,8-ij]quinolizine-10-carboxylate (Coumarin 314) and 10-acetyl-2,3,6,7-tetrahydro-1H,5H,11H-[1]benzopyrano[6,7,8-ij]quinolizin-11-one (Coumarin 334); and anthracene dyes, such as 9,10bis(phenylethynyl)anthracene and perylene. Examples of green fluorescent dyes include coumarin dyes, such as 2,3,5,6-1H,4H-tetrahydro-8-trifluoromethylquinolizine(9,9a,1-gh)coumarin (Coumarin 153), 3-(2'-benzothiazolyl)-7-diethylaminocoumarin (Coumarin 6), 3-(2'-benzoimidazolyl)-7-N,N-diethylaminocoumarin (Coumarin 7), 10-(benzothiazol-2-yl)-2,3,6,7-tetrahydro-1H,5H,11H-[1]benzopyrano[6,7,8-ij]quinolizin-11-one (Coumarin 545), Coumarin 545T, and Coumarin 545P; naphthalimide dyes, such as Basic Yellow 51, Solvent Yellow 11, Solvent Yellow 98, Solvent Yellow 116, Solvent Yellow 43, and Solvent Yellow 44; perylene dyes, such as Lumogen Yellow, Lumogen Green, and Solvent Green 5; fluorescein dyes; azo dyes, phthalocyanine dyes, anthraquinone dyes, quinacridone dyes, isoindolinone dyes, thioindigo dyes, and dioxazine dyes.

Examples of red fluorescent dyes include cyanine dyes, such as 4 dicyanomethylene-2-methyl-6-(p-dimethylaminostyryl)-4H-pyran; pyridine dyes, such as 1-ethyl-2-[4-(dimethylaminophenyl)-1,3-butadienyl]-pyridinium perchlorate (Pyridine 1); xanthene dyes, such as rhodamine B, rhodamine 6G, rhodamine 3B, rhodamine 101, rhodamine 110, Basic Violet 11, sulforhodamine 101, Basic Violet 11, Basic Red 2; perylene dyes, such as Lumogen Orange, Lumogen Pink, Lumogen Red, and Solvent Orange 55; oxazine dyes; chrysene dyes; thioflavin dyes; pyrene dyes; anthracene dyes; acridone dyes; acridine dyes; fluorene dyes; terphenyl dyes; ethane dyes; butadiene dyes; hexatriene dyes; oxazole dyes; coumarin dyes; stilbene dyes; di- and tri-phenyl methane dyes; thiazole dyes; thiazine dyes; naphthalimide dyes; and anthraquinone dyes.

In the case where the organic fluorescent dyes are used as color phosphors, it is desirable to use dyes that are not easily degraded by blue light or ultraviolet rays from a backlight or extraneous light. From this point of view, it is particularly preferable to use perylene dyes with excellent light fastness and a high quantum yield.

As the binder resin in which the organic phosphor materials are dispersed, a transparent resin is preferred. Examples of the transparent resin that may be used include acrylic resins, melamine resins, polyester resins, polyurethane resins, alkyd resins, epoxy resins, butyral resins, polysilicone resins, polyamide resins, polyimide resins, melamine resins, phenolic resins, polyvinyl alcohol, polyvinyl hydrin, hydroxyethylcellulose, carboxymethylcellulose, aromatic sulfonamide resins, urea resins, benzoguanamine resins, triacetylcellulose (TAC), polyether sulfone, polyether ketone, nylon, polystyrene, melamine beads, polycarbonate, polyvinyl chloride, polyvinylidene chloride, polyvinyl acetate, polyethylene, polymethyl methacrylate, polyMBS, medium-density polyethylene, high-density polyethylene, tetrafluoroethylene, poly(trifluorochloroethylene), and polytetrafluoroethylene.

Regarding the inorganic phosphor materials, examples of blue fluorescent materials include $Sr_2P_2O_7$: $Sn^{4+}$, $Sr_4Al_{14}O_{25}:Eu^{2+}$, $BaMgAl_{10}O_{17}:Eu^{2+}$, $SrGa_2S_4:Ce^{3+}$, $CaGa_2S_4:Ce^{3+}$, (Ba, Sr) (Mg, Mn) $Al_{10}O_{17}:Eu^{2+}$, (Sr, Ca, $Ba_2$, 0 mg)$_{10}$ $(PO_4)_6Cl_2:Eu^{2+}$, $BaAl_2SiO_8:Eu^{2+}$, $Sr_2P_2O_7$: $Eu^{2+}$, $Sr_5(PO_4)_3Cl:Eu^{2+}$, (Sr, Ca, Ba)$_5(PO_4)_3Cl:Eu^{2+}$, $BaMg_2Al_{16}O_{27}:Eu^{2+}$, (Ba, Ca)$_5(PO_4)_3Cl:Eu^{2+}$, $Ba_3MgSi_2O_8:Eu^{2+}$, and $Sr_3MgSi_2O_8:Eu^{2+}$. Examples of green fluorescent materials include (BaMg) $Al_{16}O_{27}:Eu^{2+}$, $Mn^{2+}$, $Sr_4Al_{14}O_{25}:Eu^{2+}$, (SrBa) $Al_{12}Si_2O_8:Eu^{2+}$, $(BaMg)_2 SiO_4:Eu^{2+}$, $Y_2SiO_5:Ce^{3+}$, $Tb^{3+}$, $Sr_2P_2O_7—Sr_2B_2O_5:Eu^{2+}$, $(BaCaMg)_5(PO_4)_3Cl:Eu^{2+}$, $Sr_2Si_3O_8$-$_2SrCl_2:Eu^{2+}$, $Zr_2SiO_4$, $MgAl_{11}O_{19}:Ce^{3+}$, $Tb^{3+}$, $Ba_2SiO_4:Eu^{2+}$, $Sr_2SiO_4:Eu^{2+}$, and (BaSr) $SiO_4:Eu^{2+}$.

Examples of red fluorescent materials include $Y_2O_2S$: $Eu^{3+}$, $YAlO_3:Eu^{3+}$, $Ca_2Y_2(SiO_4)_6:Ee^{3+}$, $LiY_9(SiO_4)_6O_2$: $Eu^{3+}$, $YVO_4:Eu^{3+}$, $CaS:Eu^{3+}$, $Gd_2O_3:Eu^{3+}$, $Gd_2O_2S:Eu^{3+}$, $Y(P,V)$ $O_4:Eu^{3+}$, $Mg_4GeO_{5.5}F:Mn^{4+}$, $Mg_4GeO_6:Mn^{4+}$, $K_5Eu_{2.5}(WO_4)_{6.25}$, $Na_5Eu_{2.5}(WO_4)_{6.25}$, $K_5Eu_{2.5}(MoO_4)_{6.25}$, and $Na_5Eu_{2.5}(MoO_4)_{6.25}$.

The foregoing inorganic phosphor materials may be subjected to surface modification treatment, as needed. Examples of a method of the surface modification treatment include chemical treatment using a silane coupling agent or the like; physical treatment by the addition of fine particles that are submicron in size; and a combination thereof. The inorganic materials are preferably used in consideration of stability, in other words, degradation due to excitation light and emission of light. In the case where the inorganic materials are used, the inorganic materials have an average particle size of ($d_{50}$) is preferably in the range of 0.5 µmm to 50 µm. An average particle size of less than 0.5 µm results in a marked reduction in the luminous efficiency of the phosphors.

An average particle size of more than 50 µm causes difficulty in forming a high-resolution pattern.

The phosphor layers may be formed by a publicly known wet process, for example, a coating method, e.g., a spin coating method, a dipping method, a doctor blade method, an ejection coating method, or a spray coating method, or a printing method, e.g., an ink-jet method, a letterpress printing method, an intaglio printing method, a screen printing method, or a microgravure coating method, using coating solutions to form the phosphor layers, the coating solutions being prepared by dissolving or dispersing the foregoing phosphor materials and a resin material in a solvent. Alternatively, the phosphor layers may be formed by a publicly known dry process or a laser transfer method with the foregoing materials. Examples of the dry process include a resistance heating evaporation method, an electron beam (EB) deposition method, a molecular beam epitaxy (MBE) method, a sputtering method, and an organic vapor phase deposition (OVPD) method.

The phosphor layers usually have a thickness of about 100 nm to about 100 µm and preferably 1 µm to 100 µm. A thickness of less than 100 nm results in a reduction in luminous efficiency and the degradation of the color purity due to the contamination of a necessary color with the transmitted light component of the excitation light because light emitted from the light source cannot be sufficiently absorbed. To increase the absorption of light emitted from the light source and reduce the transmission of the excitation light to the extent that the color purity is not adversely affected, the thickness is preferably 1 µm or more. A thickness of more than 100 µm does not lead to an increase in efficiency because light emitted from the light source is already sufficiently absorbed. This just consumes the materials, thus leading to an increase in material cost.

In the case where a light-scattering layer is used in place of the blue phosphor layer 3B, light-scattering particles may be composed of an organic material or an inorganic material and is preferably composed of an inorganic material. Thus, directional light from the outside (for example, the light-emitting elements) can be diffused or scattered more isotropically and effectively. By the use of the inorganic material, the light-scattering layer stable to light and heat can be provided. The light-scattering particles preferably have a high transparency. The light-scattering particles preferably have high transparency. As the light-scattering layer, fine particles are preferably dispersed in a matrix with a low refractive index, the fine particles having a higher refractive index than the matrix. To effectively scatter blue light by the light-scattering layer, the light-scattering particles need to have a particle size in the Mie scattering region. Thus, the light-scattering particles preferably have a particle size of about 100 nm to about 500 nm.

In the case where the light-scattering particles are composed of an inorganic material, for example, particles (fine particles) mainly composed of an oxide of at least one metal selected from the group consisting of silicon, titanium, zirconium, aluminum, indium, zinc, tin, and antimony are exemplified.

In the case where particles composed of an inorganic material (fine inorganic particles) are used as the light-scattering particles, for example, silica beads (refractive index: 1.44), alumina beads (refractive index: 1.63), titanium beads (refractive index, anatase: 2.50, rutile: 2.70), zirconium oxide beads (refractive index: 2.05), zinc oxide beads (refractive index: 2.00), barium titanate ($BaTiO_3$) (refractive index: 2.4), and so forth are exemplified.

In the case where particles composed of an organic material (fine organic particles) are used as the light-scattering particles, for example, polymethyl methacrylate beads (refractive index: 1.49), acrylic beads (refractive index: 1.50), acrylic-styrene copolymer beads (refractive index: 1.54), melamine beads (refractive index: 1.57), high-refractive index melamine beads (refractive index: 1.65), polycarbonate beads (refractive index: 1.57), styrene beads (refractive index: 1.60), cross-linked polystyrene beads (refractive index: 1.61), polyvinyl chloride beads (refractive index: 1.60), benzoguanamine-melamine formaldehyde beads (refractive index: 1.68), silicone beads (refractive index: 1.50), and so forth are exemplified.

As a resin material used as a mixture with the light-scattering particles, a transparent resin is preferred. Examples of the resin material include an acrylic resin (refractive index: 1.49), a melamine resin (refractive index: 1.57), nylon (refractive index: 1.53), polystyrene (refractive index: 1.60), melamine beads (refractive index: 1.57), polycarbonate (refractive index: 1.57), polyvinyl chloride (refractive index: 1.60), polyvinylidene chloride (refractive index: 1.61), polyvinyl acetate (refractive index: 1.46), polyethylene (refractive index: 1.53), polymethyl methacrylate (refractive index: 1.49), polyMBS (refractive index: 1.54), medium-density polyethylene (refractive index: 1.53), high-density polyethylene (refractive index: 1.54), tetrafluoroethylene (refractive index: 1.35), polytrifluorochloroethylene (refractive index: 1.42), and polytetrafluoroethylene (refractive index: 1.35).

[Partition]

The partition 7 according to this embodiment is composed of a material containing a resin and the light-scattering particles 7a. As with the light-scattering layers, the partition 7 preferably contains light-scattering fine particles dispersed in a resin having a low refractive index, the light-scattering particles having a higher refractive index than the resin. To effectively scatter blue light by the light-scattering partition, the light-scattering particles need to have a particle size in the Mie scattering region. Thus, the light-scattering particles preferably have a particle size of about 100 nm to about 500 nm.

As the resin, for example, the resin materials may be used. As the light-scattering particles 7a, for example, the light-scattering particles may be used.

In the case where an alkali-soluble resin is selected as a resin contained in a partition material and where a photopolymerizable monomer, a photoinitiator, and a solvent are added thereto, the partition material can be used as a photoresist and patterned by photolithography.

Each of the opening portions of the partition 7 (a section of each phosphor layer) preferably has a size of about 20 μm×about 20 μm to about 500 μm×about 500 μm. In a CIE 1976 L*a*b display system, the partition 7 preferably has a reflectance of 80% or more.

To improve contrast as in the past, a black matrix layer having a thickness of about 0.01 μm to about 3 μm, which is thinner than that of the light-scattering partition, may be interposed on the light-output direction side of the light-scattering partition. For the purposes of preventing the fact that excitation light designed to enter a pixel leaks to an adjacent pixel to cause color mixture and absorbing light that will enter the adjacent pixel, a black matrix layer having a thickness of about 0.01 μm to about 3 μm, which is thinner than that of the light-scattering partition, may be interposed on a side of the light-scattering partition opposite the light-output direction.

[Imparting Lyophobic Properties to Partition]

In the case where the phosphor layers are patterned by a dispenser method, an ink-jet method, or the like, it is absolutely necessary to impart lyophobic properties to the partition in order to prevent color mixture between adjacent pixels due to the overflow of phosphor solutions from the partition. Examples of a method for imparting lyophobic properties to the partition include methods described below.

(1) Fluorine Plasma Treatment

As disclosed in, for example, Japanese Unexamined Patent Application Publication No. 2000-76979, a substrate on which a partition has been formed is subjected to plasma treatment using a fluorine-based introduction gas, thereby imparting lyophobic properties to the partition.

(2) Addition of Fluorine-based Surface Modifier

The addition of a fluorine-based surface modifier to a material of a light-scattering partition imparts lyophobic properties to the partition. Examples of the fluorine-based surface modifier include UV-curable surface modifiers, such as DEFENSA and MEGAFACE (manufactured by DIC Corporation).

[Shape of Partition]

Regarding the shape of the partition, a tapered shape such that a portion of each opening portion of the partition on the incident side is larger than that on the emission substrate side is preferred in such a manner that light from a backlight is not incident on a pixel adjacent to a target pixel on which the light is to be incident.

To sufficiently increase the adhesion between the substrate and the partition, the ratio of the height to the breadth of the partition (aspect ratio) is preferably 1 or less.

[Color Filter]

In the phosphor substrate 10 according to this embodiment, color filters are preferably arranged between the substrate 1 disposed on the light-output side and the phosphor layers 3R, 3G, and 3B. Known color filters may be used as the color filters. Here, the arrangement of the color filters results in the enhancement of the color purities of the red pixel PR, the green pixel PG, and the blue pixel PB, thereby extending the color reproduction range of the display device 100. A blue color filter facing the blue phosphor layer 3B, a green color filter facing the green phosphor layer 3G, and a red color filter facing the red phosphor layer 3R absorb an excitation light component in extraneous light to excite the phosphor layers 3R, 3G, and 3B. This results in the reduction or prevention of the emission of the phosphor layers 3R, 3G, and 3B caused by the extraneous light, thereby reducing or preventing a reduction in contrast. Furthermore, a portion of the excitation light L1 which is not absorbed by the phosphor layers 3R, 3G, and 3B and which is transmitted is prevented from leaking to the outside by the blue color filter, the green color filter, and the red color filter. This results in the prevention of a reduction in the color purity of emission caused by color mixture due to the mixing of light emitted from the phosphor layers 3R, 3G, and 3B and the excitation light L1.

(Light Source)

In the phosphor substrate 10 according to this embodiment, a light source configured to emit excitation light with which the phosphor layers 3R, 3G, and 3B are irradiated may be provided on the outer side of the substrate 13 to form a display device. As light to excite the phosphor layers 3R, 3G, and 3B, ultraviolet light or blue light is preferred. Examples of a light source configured to emit excitation light include ultraviolet LEDs, blue LEDs, inorganic ultraviolet EL elements, inorganic blue EL elements, organic ultraviolet EL elements, and organic blue EL elements. This embodiment is not limited to these light sources. The on-off control of emission to display an image may be achieved by directly switching these light sources. Alternatively, the on-off control of emission may be achieved by arranging and controlling layers which have a shutter function and which are composed of, for example, a liquid crystal, between the light source 11 and the phosphor layers 3R, 3G, and 3B. Furthermore, the on-off control may be achieved by the use of the light source and the layers which have a shutter function and which are composed of, for example, a liquid crystal.

Examples of the light source that may be used include, but are not limited to, known ultraviolet LEDs, blue LEDs, inorganic ultraviolet EL elements, inorganic blue EL elements, organic ultraviolet EL elements, and organic blue EL elements. The light source may be produced by a known production method with a known material. Here, the ultraviolet light preferably has a main emission peak at 360 nm to 410 nm. The blue light preferably has a main emission peak at 410 nm to 480 nm. The light source preferably has directivity. The term "directivity" refers to a property in which light intensity varies depending on the direction. The light source may have directivity just when light is incident on the phosphor layers. The light source preferably allows parallel light to be incident on the phosphor layers.

Regarding the degree of directivity of the light source, the half-width is preferably 30° or less and more preferably 10° or less. At a half-width of more than 30°, light emitted from a backlight is incident on a pixel other than a target pixel to excite an unintended phosphor, thereby reducing the color purity and the contrast.

A light-emitting element that may be suitably used for the light source will be described below.

[LED]

Figure 4:
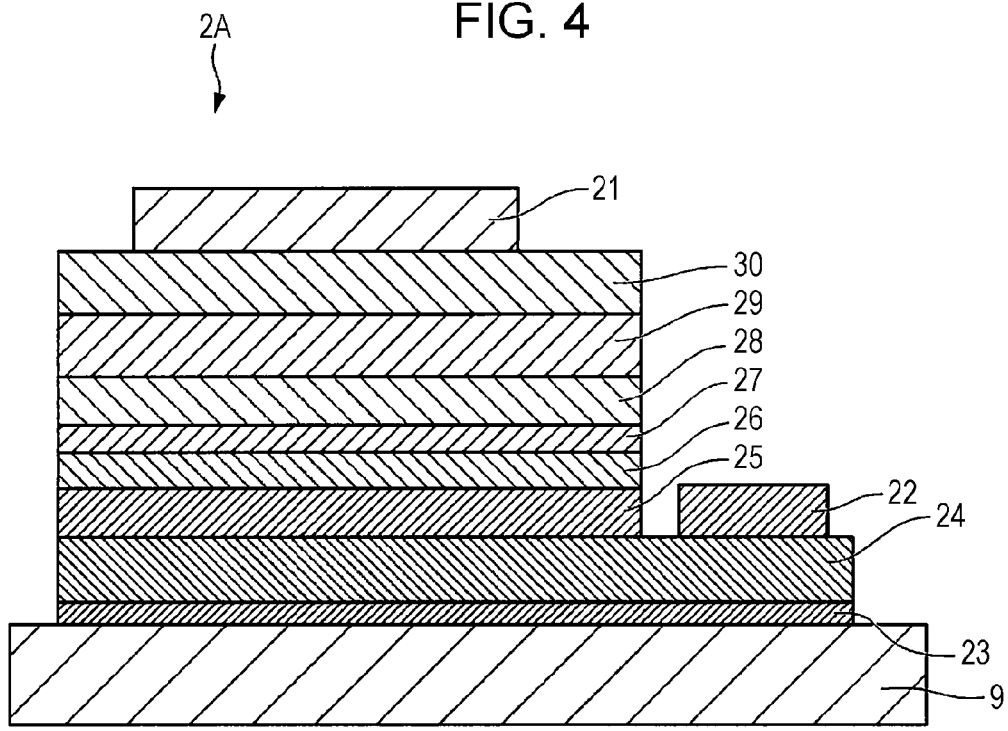
FIG. 4 is a schematic cross-sectional view of an LED as an example of a light-emitting element.

As illustrated in FIG. 4, a light-emitting diode (LED) may be used as a light-emitting element 2A. A known LED may be used as the LED. For example, an inorganic ultraviolet LED and inorganic blue LED are preferred. Each of the LEDs is formed of, for example, the light-emitting element 2A having a structure in which a first buffer layer 23, an n-type contact layer 24, a second n-type cladding layer 25, a first n-type cladding layer 26, an active layer 27, a first p-type cladding layer 28, a second p-type cladding layer 29, and a second buffer layer 30 are stacked, in that order, on a surface of a substrate 9, a cathode 22 being disposed on the n-type contact layer 24, and an anode 21 being disposed on the second buffer layer 30. The specific structure of the LED is not limited thereto.

The active layer 27 is a layer configured to emit light by the recombination of electrons and holes. A known active layer material for LEDs may be used as an active layer material for the active layer 27. Regarding the active layer material, examples of an active layer material for ultraviolet emission include AlGaN, InAlN, and $In_aAl_bGa_{1-a-b}N$ ($0 \le a$, $0 \le b$, $a+b \le 1$). An example of an active layer material for blue emission is $In_xGa_{1-z}N$ ($0<z<1$). The active layer material is not limited thereto.

The active layer 27 may have a single quantum well structure or a multiple quantum well structure.

The active layer having a quantum well structure may be of n-type or p-type. In particular, a undoped (no addition of impurities) active layer is preferred because the full width at half maximum of the emission wavelength is reduced by band-to-band emission and thus light with high color purity is emitted.

The active layer 27 may be doped with at least one of a donor impurity and an acceptor impurity. In the case where the crystallinity of an active layer doped with an impurity is the same as that of an undoped active layer, when the active layer is doped with a donor impurity, the intensity of the band-to-band emission can be further increased, compared with an undoped active layer.

When the active layer is doped with an acceptor impurity, the peak wavelength can be shifted to the lower energy side by about 0.5 eV from the peak wavelength of band-to-band emission. However, the full width at half maximum is broadened. When the active layer is doped with both an acceptor impurity and a donor impurity, the emission intensity can be further increased, compared with the emission intensity of an active layer doped with only an acceptor impurity. In particular, when an active layer doped with an acceptor impurity is formed, the conductivity type of the active layer is preferably set to be n-type by also performing doping with a donor impurity, such as Si.

The n-type cladding layers 25 and 26 may be composed of a known n-type cladding layer material for LEDs. In an example illustrated in FIG. 4, the n-type cladding layers are formed of two layers: the first n-type cladding layer 26 and the second n-type cladding layer 25. Alternatively, the n-type cladding layers may be formed of a single layer or multiple layers of three or more. By forming the n-type cladding layers using an n-type semiconductor material having a band gap energy larger than that of the active layer 27, a potential barrier for holes is formed between the n-type cladding layer and the active layer 27. This results in the confinement of holes in the active layer. For example, the n-type cladding layers 25 and 26 may be composed of n-type $In_xGa_{1-x}N$ ($0 \le x < 1$). However, the n-type cladding layers 25 and 26 are not limited thereto.

The p-type cladding layers 28 and 29 may be composed of a known p-type cladding layer material for LEDs. In the example illustrated in FIG. 4, the p-type cladding layers may be formed of two layers: the first p-type cladding layer 28 and the second p-type cladding layer 29. Alternatively, the p-type cladding layers may be formed of a single layer or multiple layers of three or more. By forming the p-type cladding layers using a p-type semiconductor material having a band gap energy larger than that of the active layer 27, a potential barrier for electrons is formed between the p-type cladding layer and the active layer 27. This results in the confinement of electrons in the active layer 27. For example, the p-type cladding layers 28 and 29 may be composed of $Al_yGa_{1-y}N$ ($0 \le y \le 1$). However, p-type cladding layers 28 and 29 are not limited thereto.

The n-type contact layer 24 may be composed of a known contact layer material for LEDs. For example, an n-type contact layer composed of n-type GaN may be disposed as a layer which is in contact with the n-type cladding layer and on which an electrode (cathode 22) is disposed. A p-type contact layer composed of p-type GaN may be disposed as a layer which is in contact with the p-type cladding layer and on which an electrode (anode 21) is disposed. Here, if the second n-type cladding layer 25 and the second p-type cladding layer 29 are composed of GaN, this contact layer is not necessarily disposed. The second n-type and p-type cladding layers may serve as the contact layers.

While each of the foregoing layers may be formed by a known deposition process for LEDs, the deposition process is not particularly limited. For example, each of the foregoing layer may be formed by a vapor deposition method, for example, metal-organic vapor phase epitaxy (MOVPE), molecular beam epitaxy (MBE), or hydride vapor phase epitaxy (HDVPE), on a substrate, for example, a sapphire substrate (including C plane, A plane, or R plane), SiC (including 6H—SiC or 4H—SiC), spinel ($MgAl_2O_4$, particularly its (111) plane), a ZnO substrate, a Si substrate, a GaAs substrate, or another oxide single-crystal substrate (e.g., NGO).

[Organic EL Element]

Figure 5:
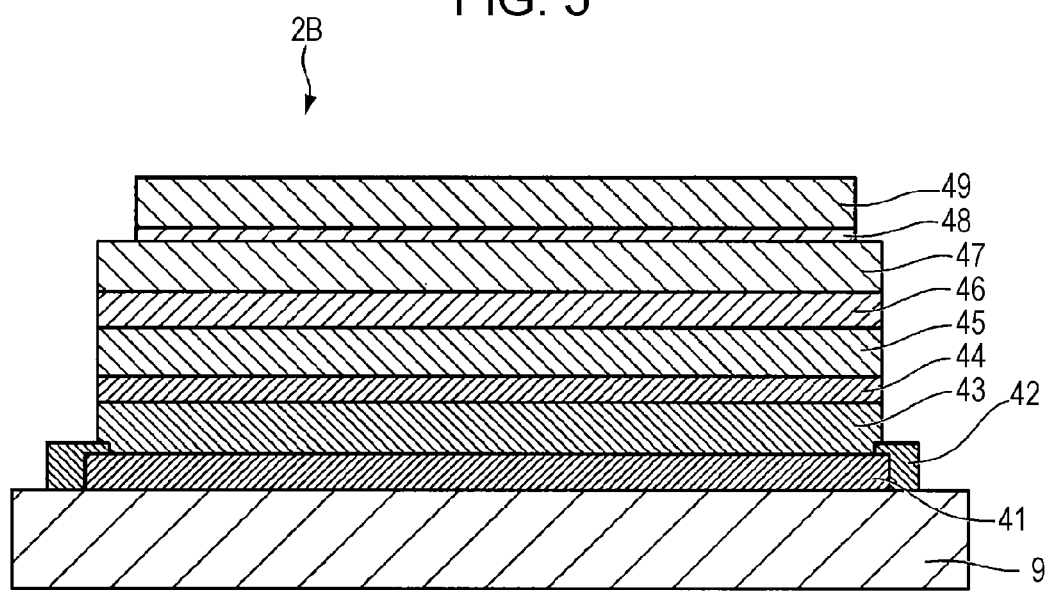
FIG. 5 is a schematic cross-sectional view of an organic EL element as an example of a light-emitting element.

As illustrated in FIG. 5, an organic EL element may be used as a light-emitting element 2B. A known organic EL element may be used as the organic EL element used in this embodiment. The organic EL element 2B is formed of, for example, the light-emitting element 2B having a structure in which an anode 41, a hole injection layer 43, a hole transport layer 44, a light-emitting layer 45, a hole blocking layer 46, an electron transport layer 47, an electron injection layer 48, and a cathode 49 are stacked, in that order, on a surface of the substrate 9. An edge cover 42 is disposed so as to cover an end face of the anode 41. The organic EL element 2B may include an organic EL layer including a light-emitting layer (organic light-emitting layer) 45 composed of at least an organic light-emitting material between the anode 41 and the cathode 49. Specific structure is not limited thereto. In the following description, the layers from the hole injection layer 43 to the electron injection layer 48 are also referred to as an "organic EL layer".

The organic EL elements 2B are arranged in a matrix in response to each of the red pixels PR, the green pixels PG, and the blue pixels PB illustrated in FIG. 1, and the individual on-off control is achieved.

The addressing method of the plural organic EL elements 2B may be active matrix addressing or passive matrix addressing. An example of the structure of the active matrix addressed organic EL elements will be described in detail below.

The components of the organic EL element 2B will be described in detail below.

[Substrate]

Examples of the substrate 9 used in this embodiment include inorganic material substrates composed of glass, silica, and so forth; plastic substrates composed of polyethylene terephthalate, polycarbazole, polyimide, and so forth; insulating substrates, such as ceramic substrates composed of alumina and so forth; metal substrates composed of aluminum (Al), iron (Fe), and so forth; substrates obtained by coating the foregoing substrates with insulators composed of silicon oxide ($SiO_2$), organic insulating materials, and so forth; and substrates obtained by subjecting surfaces of metal substrates composed of Al and so forth to insulating treatment by, for example, anodic oxidation. Furthermore, a substrate obtained by coating the plastic substrate with an inorganic material or a substrate obtained by coating the metal substrate with an inorganic insulating material is more preferred. In this case, it is possible to prevent the permeation of water that can be caused when a plastic substrate is used as a substrate for organic EL elements. Furthermore, it is possible to prevent the occurrence of leakage (short circuit) due to a protrusion of the metal substrate, which is the biggest problem when the metal substrate is used as a substrate for organic EL elements (it is known that leakage (short circuit) due to a protrusion occurs markedly at a pixel because organic EL elements have a very small thickness of about 100 nm to about 200 nm).

In the case where thin-film transistors (TFTs) are formed to drive the organic EL elements in an active matrix manner, a substrate that does not melt or distort at a temperature of 500° C. or lower is preferably used. A common metal substrate differs in thermal expansion coefficient from glass. It is thus difficult to form TFTs on the metal substrate with conventional production equipment. The linear expansion coefficient is matched with that of glass by the use of a metal substrate composed of an iron-nickel based alloy having a linear expansion coefficient of $1\times10^{-5}$/° C. or less, thereby enabling TFTs to be formed on the metal substrate with conventional production equipment at low cost. A plastic substrate has a very low heat-resistant temperature. Thus, TFTs may be formed on a glass substrate and then transferred onto a plastic substrate to provide the TFTs on the plastic substrate.

In the case where light emitted from the organic EL layer is output from a side of the organic EL layer opposite the side adjacent to the substrate, there are no limitations on the substrate. In the case where light emitted from the organic EL layer is output from the substrate side, a transparent or translucent substrate needs to be used to output light emitted from the organic EL layer to the outside.

[Anode] and [Cathode]

The anode 41 and the cathode 49 used in this embodiment serve as a first electrode and a second electrode configured to supply the organic EL layer with current. In FIG. 5, the anode 41 serving as the first electrode is arranged on a side of the organic EL layer adjacent to the substrate 9. The cathode 49 serving as the second electrode is arranged on a side of the organic EL layer opposite the side adjacent to the substrate 9. This relationship may be reversed. Specifically, the anode 41 serving as the first electrode may be arranged on a side of the organic EL layer opposite the side adjacent to the substrate 9, and the cathode 49 serving as the second electrode may be arranged on a side of the organic EL layer adjacent to the substrate 9. While a specific compound and a formation method will be illustrated below, the compound and the formation method are not limited thereto.

The anode 41 and the cathode 49 may be composed of a known electrode material. From the viewpoint of more efficiently injecting holes into the organic EL layer, examples of an electrode material used to form the anode include metals, such as gold (Au), platinum (Pt), and nickel (Ni), which have a work function of 4.5 eV or more, and oxides, such as an oxide (ITO) of indium (In) and tin (Sn), an oxide ($SnO_2$) of tin (Sn), and an oxide (IZO) of indium (In) and zinc (Zn), these materials being used as transparent electrode materials. From the viewpoint of more efficiently injecting electrons into the organic EL layer, examples of an electrode material used to form the cathode 49 include metals, such as lithium (Li), calcium (Ca), cerium (Ce), barium (Ba), and aluminum (Al), which have a work function of 4.5 eV or less, and alloys containing these metals, e.g., Mg—Ag alloys and Li:Al alloys.

The anode 41 and the cathode 49 may be formed with the foregoing materials by a known method, such as an EB deposition method, a sputtering method, an ion plating method, or a resistance heating evaporation method. The method for forming the anode and the cathode is not limited to these formation methods. The electrodes may be patterned by a photolithography method or a laser lift-off method, as needed. Alternatively, directly patterned electrodes may be formed using a shadow mask in combination. The thickness is preferably 50 nm or more. A thickness of less than 50 nm results in a high wiring resistance, thus possibly causing an increase in driving voltage.

In the case where a micro-cavity effect is used in order to improve the color purity, the luminous efficiency, and the front luminance and where light emitted from the organic EL layer is output from the anode 41 side, a translucent electrode is preferably used as the anode 41. Here, a metal material for the translucent electrode may be used. Alternatively, a metal material for the translucent electrode and a metal material for the transparent electrode may be combined together. Silver is preferably used as the translucent electrode material in view of reflectance and transmittance. The translucent electrode preferably has a thickness of 5 nm to 30 nm. A thickness of less than 5 nm fails to sufficiently reflect light, thereby failing to sufficiently providing the interference effect. A thickness of more than 30 nm results in a marked reduction in the transmittance of light, thereby possibly reducing the luminance and efficiency. An electrode which reflects light and which has high reflectance is preferably used as the cathode 49. Regarding an electrode material used therefor, examples thereof include reflective metal electrodes composed of, for example, aluminum, silver, gold, aluminum-lithium alloys, aluminum-neodymium alloys, and aluminum-silicon alloys; electrodes obtained by combining transparent electrodes and the reflective metal electrodes (reflective electrodes).

In the case where light emitted from the organic EL layer is output from the cathode 49 side, the anode 41 may be formed of an electrode having high reflectance, and the cathode 49 may be formed of a translucent electrode, on the contrary to the case described above.

[Organic EL Layer]

The organic EL layer according to this embodiment may have a single-layer structure including an organic light-emitting layer or a multilayer structure including an organic light-emitting layer and a charge transport layer. Specifically, the following structures are listed. The organic EL layer, however, is not limited thereto. In the example illustrated in FIG. 5, a structure of item (8) is used. In the following description, holes and electrons are referred to as "charges". A layer (the hole injection layer or the electron injection layer) configured to inject charges from the anode 41 or the cathode 49 toward the light-emitting layer 45 is referred to as a "charge injection layer". A layer (the hole transport layer or the electron transport layer) configured to transport the charges toward the light-emitting layer 45, the charges being injected from the anode 41 or the cathode 49 with the charge injection layer, is referred to as a "charge transport layer". The charge injection layer and the charge transport layer may be collectively referred to as a "charge injection/transport layer".

(1) Organic light-emitting layer
(2) Hole transport layer/organic light-emitting layer
(3) Organic light-emitting layer/electron transport layer
(4) Hole transport layer/organic light-emitting layer/electron transport layer
(5) Hole injection layer/hole transport layer/organic light-emitting layer/electron transport layer
(6) Hole injection layer/hole transport layer/organic light-emitting layer/electron transport layer/electron injection layer
(7) Hole injection layer/hole transport layer/organic light-emitting layer/hole blocking layer/electron transport layer
(8) Hole injection layer/hole transport layer/organic light-emitting layer/hole blocking layer/electron transport layer/electron injection layer
(9) Hole injection layer/hole transport layer/electron blocking layer/organic light-emitting layer/hole blocking layer/electron transport layer/electron injection layer Each of the organic light-emitting layer, the hole injection layer, the hole transport layer, the hole blocking layer, the electron blocking layer, the electron transport layer, and the electron injection layer may have a single-layer structure or a multilayer structure.

The light-emitting layer 45 may be composed of only an organic light-emitting material described below or a combination of a light-emitting dopant and a host material. The light-emitting layer 45 may optionally contain a hole transport material, an electron transport material, and additives (e.g., donor and acceptor). The light-emitting layer 45 may have a structure in which the material is dispersed in a polymeric material (binder resin) or an inorganic material. In view of luminous efficiency and lifetime, the organic light-emitting layer preferably contains a light-emitting dopant dispersed in a host material.

Known light-emitting materials for organic EL may be used as the organic light-emitting material. The organic light-emitting material is classified into a low-molecular-weight light-emitting material and a high-molecular-weight light-emitting material. While specific compounds thereof are exemplified below, the organic light-emitting material is not limited these materials. The light-emitting materials may be classified into fluorescent materials and phosphorescent materials. The phosphorescent materials having high luminous efficiency are preferably used from the viewpoint of reducing the power consumption.

While specific compounds are exemplified below, the organic light-emitting materials are not limited these materials.

A known dopant material for organic EL may be used as the light emitting dopant optionally contained in the light-emitting layer. The dopant material is described below. Examples of an ultraviolet-light-emitting material include fluorescent light-emitting materials, such as p-quaterphenyl, 3,5,3,5-tetra-t-butylsexiphenyl, and 3,5,3,5tetra-t-butyl-p-quinquephenyl. Examples of a blue-light-emitting material include fluorescent light-emitting materials, such as styryl derivatives; and phosphorescent-light-emitting organic metal complexes, such as bis[(4,6-difluorophenyl)-pyridinato-N, C2']picolinatoiridium(III) (FIrpic) and iridium(III) bis(4',6'-difluorophenylpyridinato)tetrakis(1-pyrazolyl)borate (FIr6).

A known host material for organic EL may be used as the host material in use of the dopant. Examples of the host material include the foregoing low-molecular-weight light-emitting materials and high-molecular-weight light emitting materials; carbazole derivatives, such as 4,4'-bis(carbazole) biphenyl, 9,9-di(4-dicarbazole-benzyl)fluorene (CPF), 3,6-bis(triphenylsilyl)carbazole (mCP), and (PCF); aniline derivatives, such as 4(diphenylphosphoryl)-N,N-diphenylaniline (HM-A1); and fluorene derivatives, such as 1,3-bis(9-phenyl-9H-fluoren-9-yl)benzene (mDPFB) and 1,4-bis(9-phenyl-9H-fluoren-9-yl)benzene (pDPFB).

The charge injection/transport layer is classified into the charge injection layer (the hole injection layer and the electron injection layer) and the charge transport layer (the hole transport layer and the electron transport layer) for the purposes of more efficiently injecting charges (holes and electrons) from the electrode and transporting (injecting) into the light-emitting layer. The charge injection/transport layer may be composed of only a charge injection/transport material described below. The charge injection/transport layer may optionally contain additives (e.g., donor and acceptor). The charge injection/transport layer may have a structure in which the charge injection/transport material is dispersed in a polymeric material (binder resin) or an inorganic material.

A known charge transport material for organic EL or organic photoconductors may be used as the charge injection/transport material. The charge injection/transport material is classified into a hole injection/transport material and an electron injection/transport material. While specific compounds thereof are exemplified below, the charge injection/transport material is not limited these materials.

Examples of the hole injection/transport material include low-molecular-weight materials, such as oxides, e.g., vanadium oxide ($V_2O_5$) and molybdenum oxide ($MoO_3$), inorganic p-type semiconductor materials, porphyrin compounds, aromatic tertiary amine compounds, e.g., N,N'-bis(3-methylphenyl)-N,N'-bis(phenyl)benzidine (TPD) and N,N'-di(naphthalen-1-yl)-N,N'-diphenylbenzidine (NPD), hydrazone compounds, quinacridone compounds, and styrylamine compounds; and high-molecular-weight materials, such as polyaniline (PANI), polyaniline-camphorsulfonic acid (PANI-CSA), 3,4-polyethylenedioxythiophene/polystyrene sulfonate (PEDOT/PSS), poly(triphenylamine) derivatives (Poly-TPD), polyvinylcarbazole (PVCz), poly(p-phenylenevinylene) (PPV), and poly(p-naphthalenevinylene) (PNV).

From the viewpoint of more efficiently performing the injection and transport of holes from the anode 41, a material used for the hole injection layer 43 preferably has a lower energy level of the highest occupied molecular orbital (HOMO) than a hole injection/transport material used for the hole transport layer 44. The hole transport layer 44 is preferably composed of a material having a higher hole mobility than the hole injection/transport material used for the hole injection layer 43.

To improve the hole injection and transport performance, the hole injection/transport material is preferably doped with an acceptor. A known acceptor material for organic EL may be used for the acceptor. While specific compounds thereof are exemplified below, the acceptor material is not limited to these materials.

Examples of the acceptor material include inorganic materials, such as Au, Pt, W, Ir, $POCl_3$, $AsF_6$, Cl, Br, I, vanadium oxide ($V_2O_5$), and molybdenum oxide ($MoO_3$); organic materials, such as cyano group-containing compounds, e.g., 7,7,8,8-tetracyanoquinodimethane (TCNQ), tetrafluorotetracyanoquinodimethane ($TCNQF_4$), tetracyanoethylene (TCNE), hexacyanobutadiene (HCNB), and dicyclodicyanobenzoquinone (DDQ), nitro group-containing compounds, e.g., trinitrofluorenone (TNF) and dinitrofluorenone (DNF), fluoranil, chloranil, and bromanil. Among these, the cyano group-containing compounds, such as TCNQ, $TCNQF_4$, TCNE, HCNB, and DDQ, are more preferred because they can more effectively increase the carrier density.

Examples of the electron injection/transport material include low-molecular-weight materials, such as inorganic n-type semiconductor materials, oxadiazole derivatives, triazole derivatives, thiopyrazine dioxide derivatives, benzoquinone derivatives, naphthoquinone derivatives, anthraquinone derivatives, diphenoquinone derivatives, fluorenone derivatives, and benzodifuran derivatives; and high-molecular-weight materials, such as poly(oxadiazole) (Poly-OXZ) and polystyrene derivatives (PSS). In particular, examples of the electron injection material include fluorides, such as lithium fluoride (LiF) and barium fluoride ($BaF_2$), and oxides, such as lithium oxide ($Li_2O$).

From the viewpoint of more efficiently performing the injection and transport of electrons from the cathode 49, a material used for the electron injection layer 48 preferably has a higher energy level of the lowest unoccupied molecular orbital (LUMO) than an electron injection/transport material used for the electron transport layer 47. A material used for the electron transport layer 47 preferably has a higher electron mobility than the electron injection/transport material used for the electron injection layer 48.

To improve the electron injection and transport performance, the electron injection/transport material is preferably doped with a donor. A known donor material for organic EL may be used for the donor. While specific compounds thereof are exemplified below, the donor material is not limited to these materials.

Examples of the donor material include inorganic materials, such as alkali metals, alkaline earth metals, rare earth elements, Al, Ag, Cu, and In; and organic materials, such as anilines, phenylenediamines, compounds each having an aromatic tertiary amine in its skeleton, e.g., benzidines (N,N,N',N'-tetraphenylbenzidine, N,N'-bis-(3-methylphenyl)-N,N'-bis-(phenyl)benzidine, and N,N'-di(naphthalen-1-yl)-N,N'-diphenylbenzidine), triphenylamines (triphenylamine, 4,4'4"-tris(N,N-diphenylamino)triphenylamine, 4,4'4"-tris(N-3-methylphenyl-N-phenylamino)triphenylamine, and 4,4'4"-tris(N-(1-naphthyl)-N-phenylamino)triphenylamine), and triphenyldiamines (N,N'-di(4-methylphenyl)-N,N'-diphenyl-1,4-phenylenediamine), fused polycyclic compounds, e.g., phenanthrene, pyrene, perylene, anthracene, tetracene, and pentacene (provided that the fused polycyclic compounds may have substituents), tetrathiafulvalene (TTF), dibenzofuran, phenothiazine, and carbazole.

Among these, compounds each having an aromatic tertiary amine in its skeleton, fused polycyclic compounds, and alkali metals are more preferred because they can more effectively increase the carrier density.

Each of the organic EL layers, such as the light-emitting layer 45, the hole transport layer 44, the electron transport layer 47, the hole injection layer 43, and the electron injection layer 48 may be formed by a known wet process, for example, a coating method, e.g., a spin coating method, a dipping method, a doctor blade method, a discharge coating method, or a spray coating method, or a printing method, e.g., an ink-jet method, a letterpress printing method, an intaglio printing method, a screen printing method, or a microgravure coating method, using a coating solution to form the organic EL layer, the coating solution being prepared by dissolving or dispersing the foregoing material in a solvent. Alternatively, the organic EL layers may be formed by a known dry process, for example, a resistance heating evaporation method, an electron beam (EB) deposition method, a molecular beam epitaxy (MBE) method, a sputtering method, or an organic vapor phase deposition (OVPD) method, or by a laser transfer method using the foregoing material. In the case where the organic EL layer is formed by the wet process, the coating solution to form the organic EL layer may contain additives to adjust the physical properties of the coating solution, for example, a leveling agent and a viscosity modifier.

Each of the organic EL layers usually has a thickness of about 1 nm to about 1000 nm and preferably 10 nm to 200 nm. A thickness of less than 10 nm fails to provide the required physical properties (injection, transport, and confinement properties of charges). Furthermore, pixel defects can be caused by foreign matter, such as dust. A thickness of more than 200 nm results in an increase in driving voltage due to a resistance component in the organic EL layer, thereby leading to an increase in power consumption.

[Edge Cover]

In the example illustrated in FIG. 5, the edge cover 42 is provided at an edge portion of the anode 41 located on the substrate 9 side for the purpose of preventing the occurrence of leakage between the anode 41 and the cathode 49. The edge cover 42 may be formed by a known method, for example, an EB deposition method, a sputtering method, an ion plating method, or a resistance heating evaporation method with an insulating material and may be patterned by a known dry or wet photolithography method. A method for the edge cover 42 is not limited to these formation methods.

A known material may be used as a material for the edge cover 42. The material is not particularly limited in this embodiment. In the case where the material needs to transmit light, examples of the material include SiO, SiON, SiN, SiOC, SiC, HfSiON, ZrO, HfO, and LaO. The edge cover 42 preferably has a thickness of 100 nm to 2000 nm. A thickness of less than 100 nm results in insufficient insulation performance, so that leakage occurs between the anode 41 and the cathode 49, thereby causing an increase in power consumption and causing the failure of emission. At a thickness of more than 2000 nm, it takes a lot of time for the film formation process, thereby causing a reduction in productivity and causing a break of the electrode at the edge cover 42.

The organic EL element 2B preferably has a micro-cavity structure (optical micro-cavity structure) provided by a dielectric multilayer film or an interference effect between a reflective electrode and a translucent electrode used as the anode 41 and the cathode 49. This allows the concentration of light emitted from the organic EL element 2B in the front direction (providing directivity), a reduction in the emission loss of light that escapes to the surroundings, and an increase in the luminous efficiency at the front. It is thus possible to efficiently transfer the emission energy generated in the light-emitting layer 45 of the organic EL element 2B to each of the phosphor layers 3R, 3G, and 3B. The emission spectrum can also be adjusted by the interference effect. By adjusting the emission peak wavelength and the full width at half maximum to desired values, the emission spectrum can be adjusted. It is thus possible to provide a spectrum that enables each of the phosphor layers 3R, 3G, and 3B to be excited in a controlled manner.

The organic EL element 2B is electrically connected to an external driving circuit. In this case, the organic EL element 2B may be directly connected to the external driving circuit and may be driven. Alternatively, a switching circuit, such as a TFT, is disposed in a pixel, and external driving circuits (a scanning line electrode circuit (a source driver), a data signal electrode circuit (a gate driver), and a power supply circuit) may be electrically connected to lines to which the TFT and so forth are connected.

[Active Matrix Addressed Organic EL Element]

Figure 6:
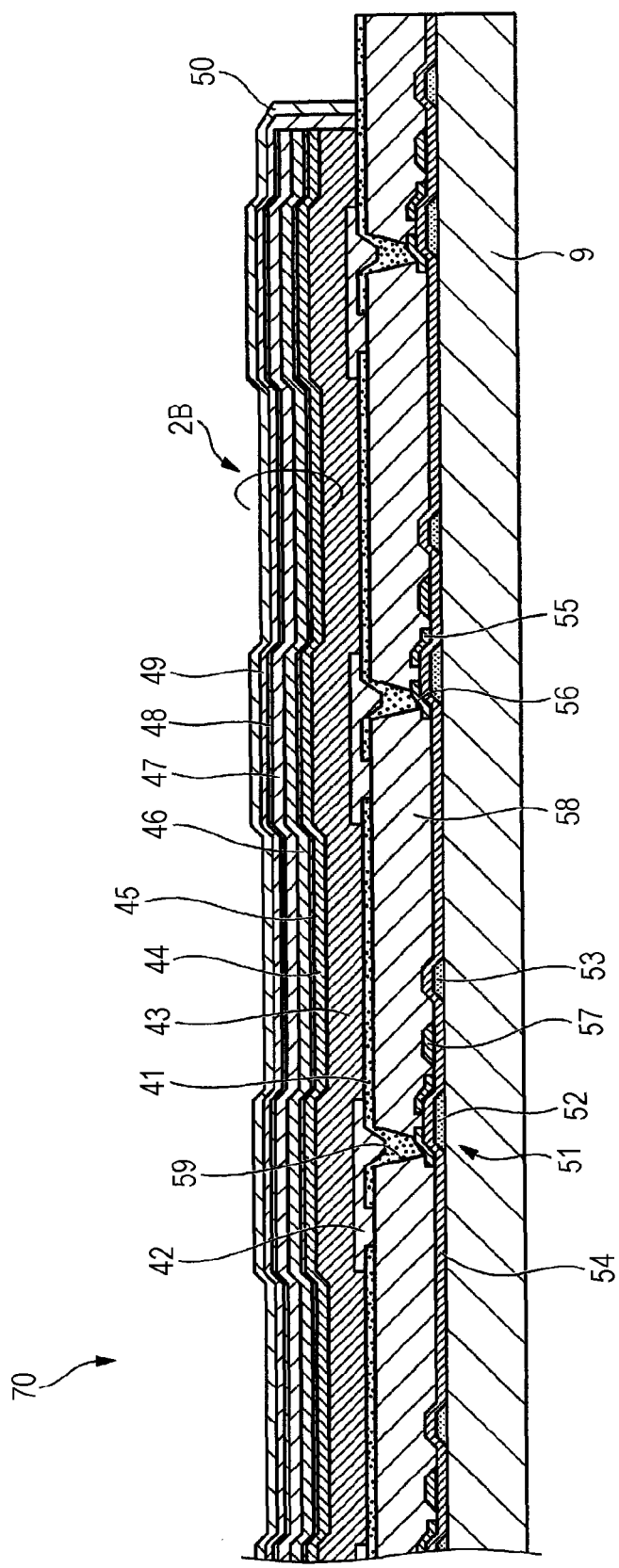
FIG. 6 is a schematic cross-sectional view of an active matrix addressed organic EL element as an example of a light-emitting element.

FIG. 6 is a cross-sectional view of an organic EL element substrate 70 (light source) including the active matrix addressed organic EL element 2B.

The organic EL element substrate 70 according to this embodiment includes TFTs (active elements) 51 on a surface of the substrate 9. Specifically, gate electrodes 52 and gate lines 53 are disposed. A gate insulating film 54 is disposed on the substrate 9 so as to cover the gate electrodes 52 and the gate lines 53. An active layer (not illustrated) is disposed on the gate insulating film 54. Source electrodes 55, drain electrodes 56, and data lines 57 are disposed on the active layer. A planarizing film 58 is disposed so as to cover the source electrodes 55, the drain electrodes 56, and the data lines 57.

The planarizing film 58 may not have a single-layer structure or may have a structure in which another interlayer insulating film and a planarizing film are combined together. Contact holes 59 passing through the planarizing film or the interlayer insulating film to reach the drain electrodes 56 are formed. The anodes 41 of the organic EL elements 2B are disposed on the planarizing film 58, the anodes 41 being electrically connected to the drain electrodes 56 through the contact holes 59. Each of the organic EL element 2B has the same structure as described above.

The TFTs 51 are formed on the substrate 9 before the formation of the organic EL elements 2B and function as elements to drive the organic EL elements. As the TFTs 51 used in this embodiment, known TFTs are exemplified. The TFTs 51 having a known structure may be formed by a known formation method using a known material. In this embodiment, metal-insulator-metal (MIM) diodes may be used in place of the TFTs 51.

Examples of a material for the active layers of the TFTs 51 include inorganic semiconductor materials, such as amorphous silicon, polysilicon, microcrystalline silicon, and cadmium selenide; oxide semiconductor materials, such as zinc oxide and indium oxide-gallium oxide-zinc oxide; and organic semiconductor materials, such as polythiophene derivatives, thiophene oligomers, poly(p-phenylenevinylene) derivatives, naphthacene, and pentacene. Examples of the structure of the TFTs 51 include a staggered type, an inverted staggered type, a top gate type, and a coplanar type.

Examples of the formation method of the active layers in the TFTs 51 include (1) a method in which an amorphous silicon film formed by a plasma-enhanced chemical vapor deposition (PECVD) method is subjected to ion doping with impurities, (2) a method in which amorphous silicon is formed by a low pressure chemical vapor deposition (LPCVD) method using silane ($SiH_4$) gas, the amorphous silicon is crystallized into polysilicon by a solid phase growth method, and then ion doping is performed by an ion implantation method, (3) a method in which amorphous silicon is formed by an LPCVD method using $Si_2H_6$ gas or a PECVD method using $SiH_4$ gas, the amorphous silicon is annealed by using a laser such as an excimer laser and crystallized into polysilicon, and then ion doping is performed (low-temperature process), (4) a method in which a polysilicon layer is formed by an LPCVD method or a PECVD method and thermally oxidized at 1000° C. or higher to form a gate insulating film, a gate electrode composed of $n^+$ polysilicon is formed thereon, and then ion doping is performed (high-temperature process), (5) a method in which an organic semiconductor material is formed by an ink-jet method or the like, and (6) a method in which a single-crystal film of an organic semiconductor material is formed.

The gate insulating film 54 of the TFTs 51 according to this embodiment may be composed of a known material. Examples of the material include $SiO_2$ formed by a PECVD method or an LPCVD method and $SiO_2$ formed by thermal oxidation of a polysilicon film. The data lines 57, the gate lines 53, the source electrodes 55, and the drain electrodes 56 of the TFTs 51 used in this embodiment may be composed of a known conductive material. Examples thereof include tantalum (Ta), aluminum (Al), and copper (Cu). The TFTs 51 according to this embodiment may have the foregoing structure but is not limited to the materials, the structures, and the formation methods.

The interlayer insulating film used in this embodiment may be composed of a known material. Examples thereof include inorganic materials, such as silicon oxide ($SiO_2$), silicon nitride (SiN and $Si_3N_4$), and tantalum oxide (TaO and $Ta_2O_5$); and organic materials, such as acrylic resins and resist materials. Examples of a method for forming the interlayer insulating film include dry processes, such as a chemical vapor deposition (CVD) method and a vacuum deposition method; and wet processes, such as a spin coating method. The interlayer insulating film may be patterned by a photolithography method, as needed.

In the case where light from the organic EL element 2B is output from the side opposite to the substrate 9, a light-shielding insulating film having light-shielding properties is preferably used in order to prevent a change in the electrical characteristics of the TFTs 51 due to the incidence of extraneous light to the TFTs 51 on the substrate 9. The interlayer insulating film and the light-shielding insulating film may be used in combination. Examples of a material for the light-shielding interlayer insulating film include materials in which pigments and dyes, such as phthalocyanine and quinacridone, are dispersed in polymeric resins, such as polyimide; color resists; black matrix materials; and inorganic insulating materials, such as $Ni_xZn_yFe_2O_4$. This embodiment, however, is not limited to the materials and formation methods.

In this embodiment, the formation of the TFTs 51 and the various lines and electrodes on the substrate 9 results in irregularities on a surface. The irregularities can cause, for example, the defects and breaks of the anode 41 and the cathode 49, the defect of the organic EL layer, the short circuit between the anode 41 and the cathode 49, and a reduction in breakdown voltage in the organic EL element 2B. To prevent these phenomena, the planarizing film 58 is preferably disposed on the interlayer insulating film. The planarizing film 58 used in this embodiment may be composed of a known material. Examples of the material include inorganic materials, such as silicon oxide, silicon nitride, and tantalum oxide; and organic materials, such as polyimide, acrylic resins, and resist materials. Examples of a method for forming the planarizing film 58 include dry processes, such as a CVD method and a vacuum deposition method; and wet processes, such as a spin coating method. This embodiment, however, is not limited to the materials and formation methods. The planarizing film 58 may have a single-layer structure or a multilayer structure.

Figure 7:
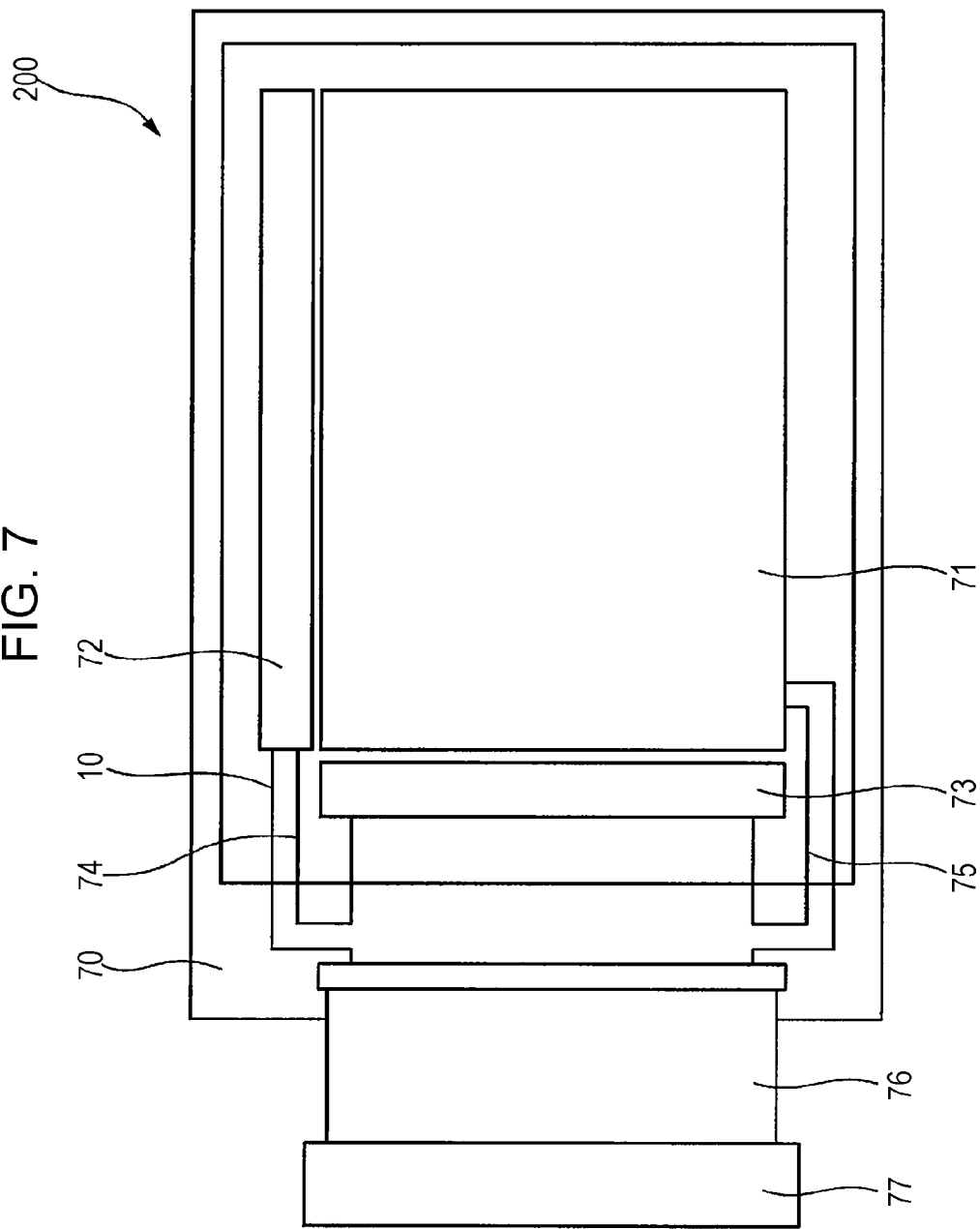
FIG. 7 is a schematic plan view of a display device.

FIG. 7 is a schematic diagram of a display device including the organic EL element substrate 70.

A display device 200 includes the organic EL element substrate 70, the phosphor substrate 10, a pixel portion 71, a gate signal driver circuit 72, a data signal driver circuit 73, a signal line 74, a current supply line 75, a flexible printed circuit board (FPC) 76, and an external driving circuit 77. The phosphor substrate 10 and the organic EL element substrate 70 are located opposite each other. The pixel portion 71 is located in a region where the organic EL element substrate 70 and the phosphor substrate 10 are located opposite each other. The gate signal driver circuit 72, the data signal driver circuit 73, the signal line 74, and the current supply line 75 supply the pixel portion 71 with a driving signal. The flexible printed circuit board 76 is connected to the organic EL element substrate 70.

The organic EL element substrate 70 according to this embodiment is electrically connected to the external driving circuit 77 through the FPC 76 in order to drive the organic EL element 2B illustrated in FIG. 6, the external driving circuit 77 including the scanning line electrode circuit, the data signal electrode circuit, the power supply circuit, and so forth. In this embodiment, the switching circuits, such as the TFTs 51, illustrated in FIG. 6 are arranged in the pixel portion 71. The TFTs 51 and so forth are connected to the lines, such as the data lines 57 and the gate lines 53. The data lines 57 and the gate lines 53 are connected to the data signal driver circuit 73 and the gate signal driver circuit 72, respectively, to drive the organic EL element 2B. The data signal driver circuit 73 and the gate signal driver circuit 72 are connected to the external driving circuit 77 through the signal line 74. The plural gate lines 53 and the plural data lines 57 are arranged in the pixel portion 71. The TFTs 51 are arranged in the vicinity of intersections of the gate lines 53 and the data lines 57.

Figure 8:
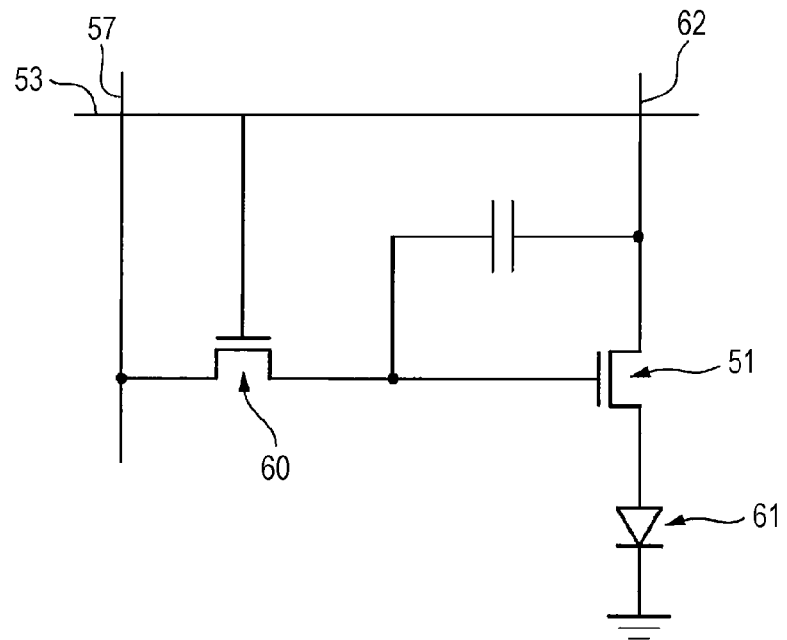
FIG. 8 illustrates an equivalent circuit of a pixel (dot) of a display device.

The organic EL element according to this embodiment is driven by a voltage-driven digital gradation method as illustrated in FIG. 8. Each pixel includes two TFTs: a switching TFT 60 and a driving TFT 51. The driving TFT 51 is electrically connected to the anode of a light-emitting portion 61 (organic EL element 2B) through the contact hole 59 formed in the planarizing film 58 illustrated in FIG. 6. In each pixel, a capacitor is arranged so as to be connected to the gate electrode of the driving TFT 51, the capacitor being configured to allow a gate potential of the driving TFT 51 to be a constant potential. The capacitor is connected to a power supply line 62. This embodiment, however, is not limited thereto. Regarding the driving method, the voltage-driven digital gray-scale method may be employed. Alternatively, a current-driven analog gray-scale method may be employed. The number of TFTs is not particularly limited. The organic EL element may be driven using the foregoing two TFTs. Alternatively, the organic EL element may be driven using two or more TFTs including a compensation circuit in a pixel for the purpose of preventing variations in TFT characteristics (mobility and threshold voltage).

[Inorganic EL Element]

Figure 9:
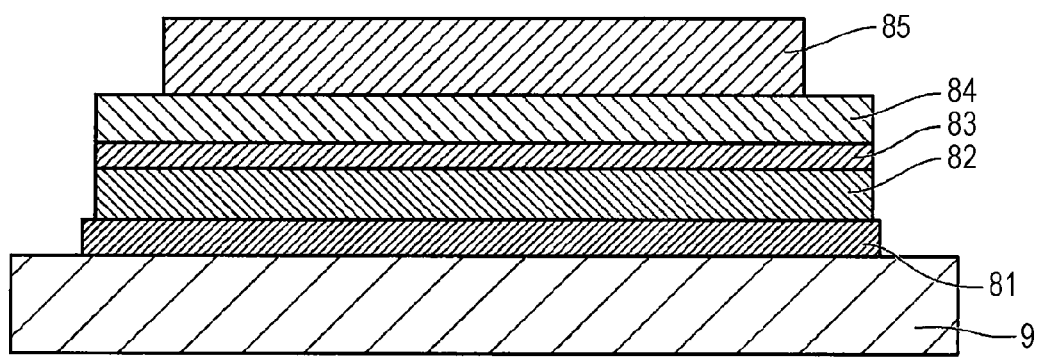
FIG. 9 is a schematic cross-sectional view of an inorganic EL element as an example of a light-emitting element.

As illustrated in FIG. 9, an inorganic EL element may be used as a light-emitting element 2C. A known inorganic EL element may be used as the inorganic EL element. For example, an inorganic ultraviolet EL element or an inorganic blue EL element is preferred. The inorganic EL element is formed of, for example, the light-emitting element 2C having a structure in which a first electrode 81, a first dielectric layer 82, a light-emitting layer 83, a second dielectric layer 84, and a second electrode 85 are stacked, in that order, on a surface of the substrate 9. The specific structure of the inorganic EL element is not limited to the foregoing structure.

The components of the inorganic EL element 2C will be described in detail below.

[First Electrode] and [Second Electrode]

Examples of a transparent electrode material for the first electrode 81 and the second electrode 85 used in this embodiment include metals, such as aluminum (Al), gold (Au), platinum (Pt), and nickel (Ni); and oxides, such as an oxide (ITO) of indium (In) and tin (Sn), an oxide ($SnO_2$) of tin (Sn), and an oxide (IZO) of indium (In) and zinc (Zn). The electrode material is not limited to these materials. An electrode disposed in a direction in which light is output is preferably a transparent electrode composed of, for example, ITO. An electrode disposed in a direction opposite to the direction in which light is output is preferably formed of a reflective film composed of, for example, aluminum.

The first electrode 81 and the second electrode 85 may be formed by a known method, for example, an EB deposition method, a sputtering method, an ion plating method, or a resistance heating evaporation method, using the foregoing material. A method for forming the electrodes is not limited these formation methods. The resulting electrodes may be patterned by a photolithography method or a laser lift-off method, as needed. Alternatively, directly patterned electrodes may be formed using a shadow mask in combination. The thickness is preferably 50 nm or more. A thickness of less than 50 nm results in a high wiring resistance, thus possibly causing an increase in driving voltage.

[Dielectric Layer]

A known dielectric material for inorganic EL may be used for the first dielectric layer 82 and the second dielectric layer 84 used in this embodiment. Examples of the dielectric material include tantalum pentoxide ($Ta_2O_5$), silicon oxide ($SiO_2$), silicon nitride ($Si_3N_4$), aluminum oxide ($Al_2O_3$), aluminum titanate ($AlTiO_3$), barium titanate ($BaTiO_3$), and strontium titanate ($SrTiO_3$). The dielectric material, however, is not limited thereto. Each of the first dielectric layer 82 and the second dielectric layer 84 according to this embodiment may be composed of one selected from the foregoing dielectric materials or may have a laminated structure composed of two or more of the materials. Each of the first dielectric layer 82 and the second dielectric layer 84 preferably has a thickness of about 200 nm to about 500 nm.

[Light-Emitting Layer]

A known light emitting material for inorganic EL may be used for the light-emitting layer 83. Examples of the light emitting material include ultraviolet-light-emitting materials, such as $ZnF_2$:Gd; and blue-light-emitting materials, such as $BaAl_2S_4$:Eu, $CaAl_2S_4$:Eu, $ZnAl_2S_4$:Eu, $Ba_2SiS_4$:Ce, ZnS:Tm, SrS:Ce, SrS:Cu, CaS:Pb, and $(Ba,Mg)Al_2S_4$:Eu. The light-emitting material is not limited thereto. The light-emitting layer 83 preferably has a thickness of about 300 nm to about 1000 nm.

As described above, in the case where the light source is disposed on the outer side of the substrate 13 as illustrated in FIG. 1, LEDs, organic EL elements, inorganic EL elements, and so forth may be preferably used as the light-emitting elements. In these exemplary structures, a sealing film or a sealing substrate configured to seal the light-emitting elements, such as the LEDs, the organic EL elements, and the inorganic EL elements is preferably arranged. The sealing film and the sealing substrate may be formed by employing a known sealing method using a known sealing material. Specifically, a sealing film may be formed by applying a resin onto a surface of the light source opposite to the substrate included in the light source by a spin coating method, ODF, or a lamination method. Alternatively, a sealing film may be formed by forming an inorganic film composed of, for example, SiO, SiON, or SiN by, for example, a plasma-enhanced CVD method, an ion plating method, an ion beam method, or a sputtering method and then applying a resin by a spin coating method, ODF, or a lamination method or then bonding a resin.

The sealing film or the sealing substrate prevents oxygen and water from entering the light-emitting elements from the outside, thereby improving the lifetime of the light source. When the light source is bonded to the phosphor substrate 10, the bonding can be performed with an adhesive layer composed of, for example, a common ultraviolet-curable resin or thermosetting resin.

In the case where the light source is directly formed on the phosphor substrate 10, a method in which an inert gas, such as nitrogen gas or argon gas, is sealed with, for example, a glass plate or a metal plate may be employed. Furthermore, the incorporation of, for example, a desiccant, such as barium oxide, into the sealed inert gas is preferred because the influence of water on the organic EL is more effectively suppressed. This embodiment, however, is not limited to the members and the formation methods. In the case where light is output from a side of the light source opposite the side adjacent to the substrate 9, the sealing film and the sealing substrate need to be composed of an optically transparent material.

In the display device 100 illustrated in FIG. 1, a polarizer may be arranged on the light-output side. A combination of a known linear polarizer and a $\lambda/4$ plate may be used as the polarizer. The arrangement of the polarizer prevents the reflection of extraneous light from the electrode of the display device 100 and the reflection of extraneous light from surfaces of the substrates 1 and 9 or a surface of the sealing substrate, thereby improving the contrast of the display device 100.

[Second Embodiment]

A second embodiment of the present invention will be described below with reference to FIGS. 10 and 11.

A display device according to this embodiment has the same basic structure as the first embodiment. The structure of the partition is different from the first embodiment. Thus, in this embodiment, the description of the basic structure of the display device is omitted, and only the partition will be described.

Figure 10:
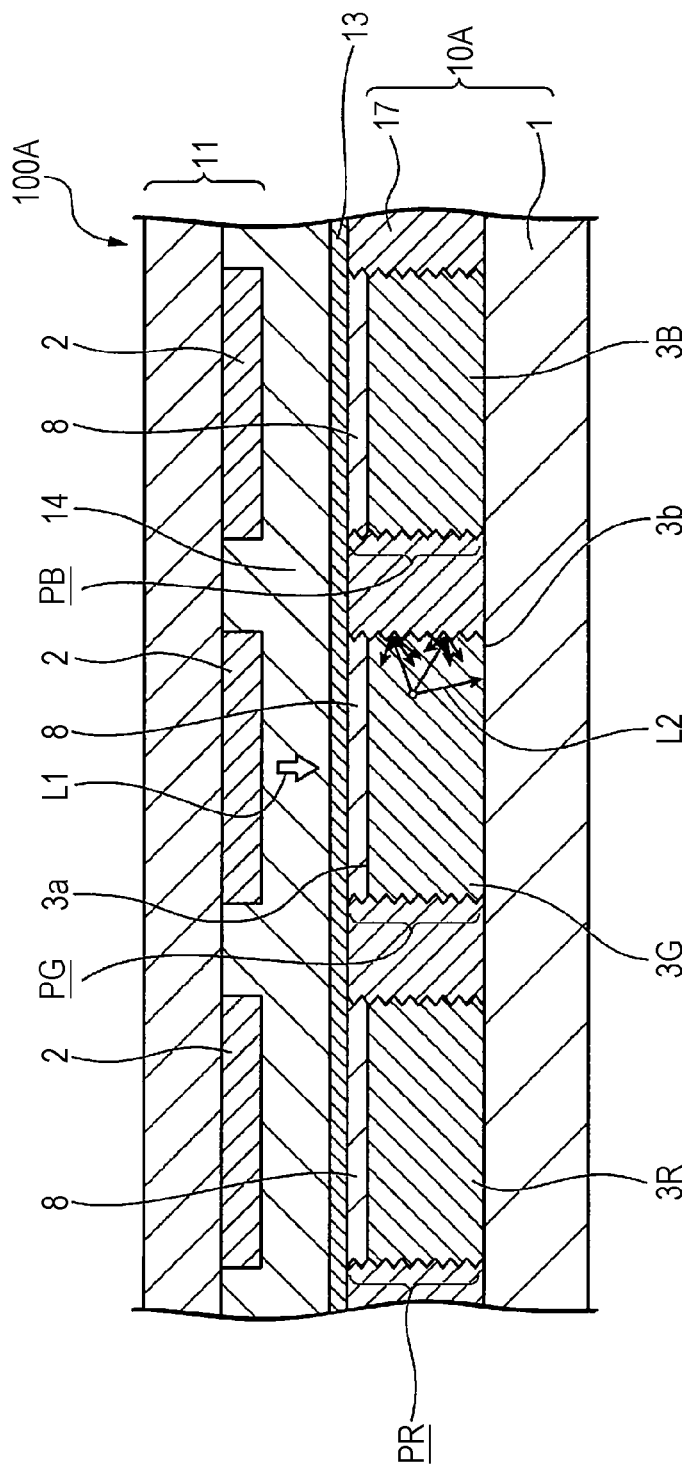
FIG. 10 is a schematic cross-sectional view of a display device according to a second embodiment of the present invention.

FIG. 10 is a schematic cross-sectional view of a display device 100A according to the second embodiment.

In the first embodiment, the partition 7 includes the light-scattering particles 7a dispersed therein. In contrast, a partition 17 according to this embodiment, portions of the partition 17 (side faces of the partition 17) in contact with the phosphor layers 3R, 3G, and 3B have an uneven shape as illustrated in FIG. 10. The remaining components are the same as the first embodiment. The partition 17 is composed of a resin. The partition 17 may be composed of a white resist. The material of the partition 17 may be the same as the resin material contained in the partition 7 described in the first embodiment.

While only the side faces of the partition 17 have the uneven shape in this embodiment, the partition 17 is not limited thereto. For example, the entire surface of the partition 17 (the top face of the partition 17 in addition to the side faces of the partition 17) has an uneven shape. In other words, at least portions of the partition 17 in contact with the phosphor layers 3R, 3G, and 3B may have light-scattering properties.

Figure 11:
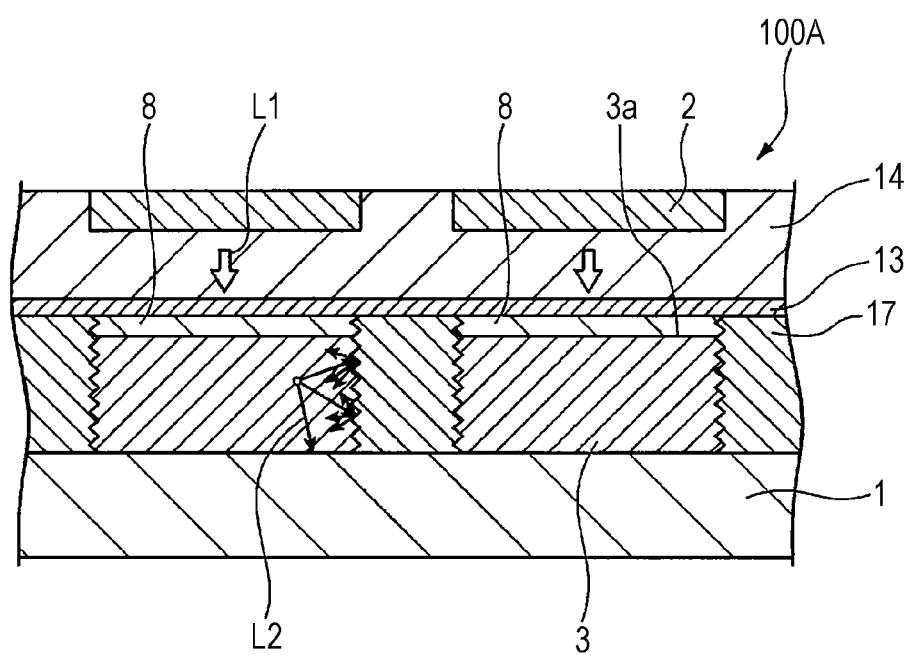
FIG. 11 is a schematic diagram illustrating the effect of a partition according to the second embodiment of the present invention.

FIG. 11 is a schematic diagram illustrating the effect of the partition 17 of the display device 100A according to the second embodiment.

In this embodiment, as illustrated in FIG. 11, since the side faces of the phosphor layers 3 have an uneven shape, the fluorescences L2 generated in the phosphor layers 3 are scattered by the uneven shape of portions of the phosphor layers 3 in contact with the partition 17. Thus, the fluorescences L2 are not easily absorbed by the partition 17. Hence, it is possible to reduce the loss of the fluorescences L2 due to the fact that the fluorescences L2 generated in the phosphor layers 3 are absorbed by the partition 17, thereby enabling the fluorescences L2 to be sufficiently output to the outside.

In this embodiment, the side faces of the partition 17 may have the uneven shape. The partition 17 may further contain the light-scattering particles 7a.

[Third Embodiment]

A third embodiment of the present invention will be described below with reference to FIG. 12.

A display device 100B according to this embodiment has the same basic structure as the first embodiment, except that color filters 4 are disposed between the substrate 1 and the phosphor layers 3 and that black layers 5 and 6 are disposed on the partition 7. Thus, in this embodiment, the description of the basic structure of the display device 100B is omitted.

Figure 12:
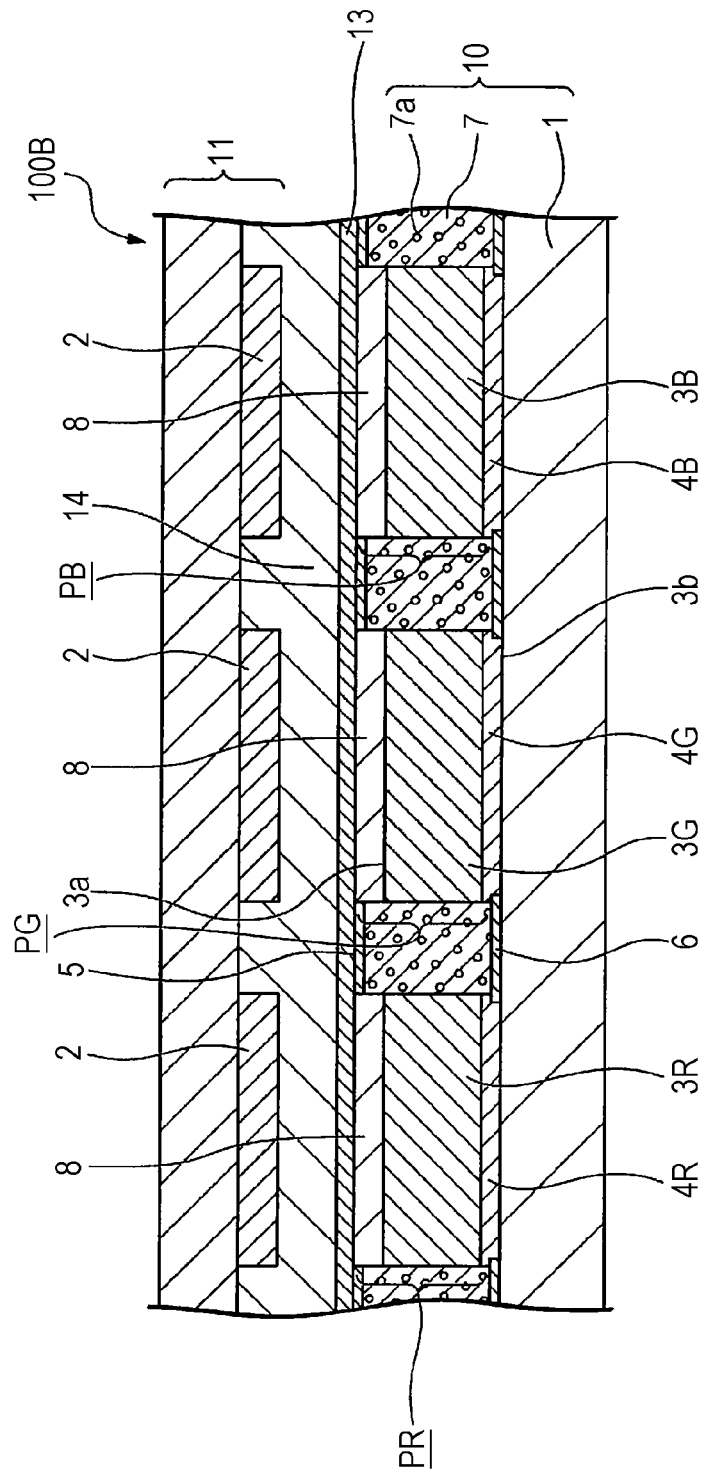
FIG. 12 is a schematic cross-sectional view of a display device according to a third embodiment of the present invention.

FIG. 12 is a schematic cross-sectional view of the display device 100B according to the third embodiment.

In the display device 100B according to this embodiment, a red color filter 4R is disposed between the substrate 1 and the red phosphor layer 3R. A green color filter 4G is disposed between the substrate 1 and the green phosphor layer 3G. A blue color filter 4B is disposed between the substrate 1 and the blue phosphor layer 3B. Thereby, it is possible to improve the chromaticity.

A first black layer 5 is disposed on the top face of the partition 7. This suppresses the leakage of light to adjacent pixels to circumvent color mixture. The first black layer 5 has a smaller thickness than the partition 7. For example, the first black layer 5 has a thickness of about 0.01 μm to about 3 μm. The first black layer 5 has a width comparable to the width of the partition 7.

A second black layers 6 is disposed on the bottom face of the partition 7 (between the substrate 1 and the partition 7), thereby improving the contrast. The second black layer 6 has a smaller thickness than the partition 7. For example, the second black layer 6 has a thickness of about 0.01 μm to about 3 μm, as with the thickness of the first black layer 5. The second black layer 6 has a larger width than the partition 7.

Regarding the width of the second black layer 6 and the partition 7, the width of the second black layer is preferably larger than that of the partition 7. In this case, the partition 7 is hidden behind the second black layer 6 when a screen is seen, thus resulting in a high contrast.

Regarding the thickness of the second black layer 6 and the color filters 4, the thickness of the color filters 4 is preferably larger than that of the second black layer 6. The reason for this is that If the thickness of the color filters 4 is smaller than that of the second black layer 6, the side faces of the phosphor layers 3 are in contact with the second black layer 6, thereby causing a phenomenon in which light emitted from the phosphor layers 3 is absorbed by the second black layer 6 to reduce the light-output efficiency.

In this embodiment, the black layers are disposed on both of the top and bottom faces of the partition 7, the black layers are not limited thereto. For example, the black layer may be disposed only on the top face or only on the bottom face of the partition 7.

[Fourth Embodiment]

A fourth embodiment of the present invention will be described below with reference to FIG. 13.

A display device 100C according to this embodiment has the same basic structure as the first embodiment. The fact that a band pass filter 12 is disposed on top faces of the planarizing layers 8 is different from the first embodiment. Thus, the description of the basic structure of the display device 100C is omitted.

Figure 13:
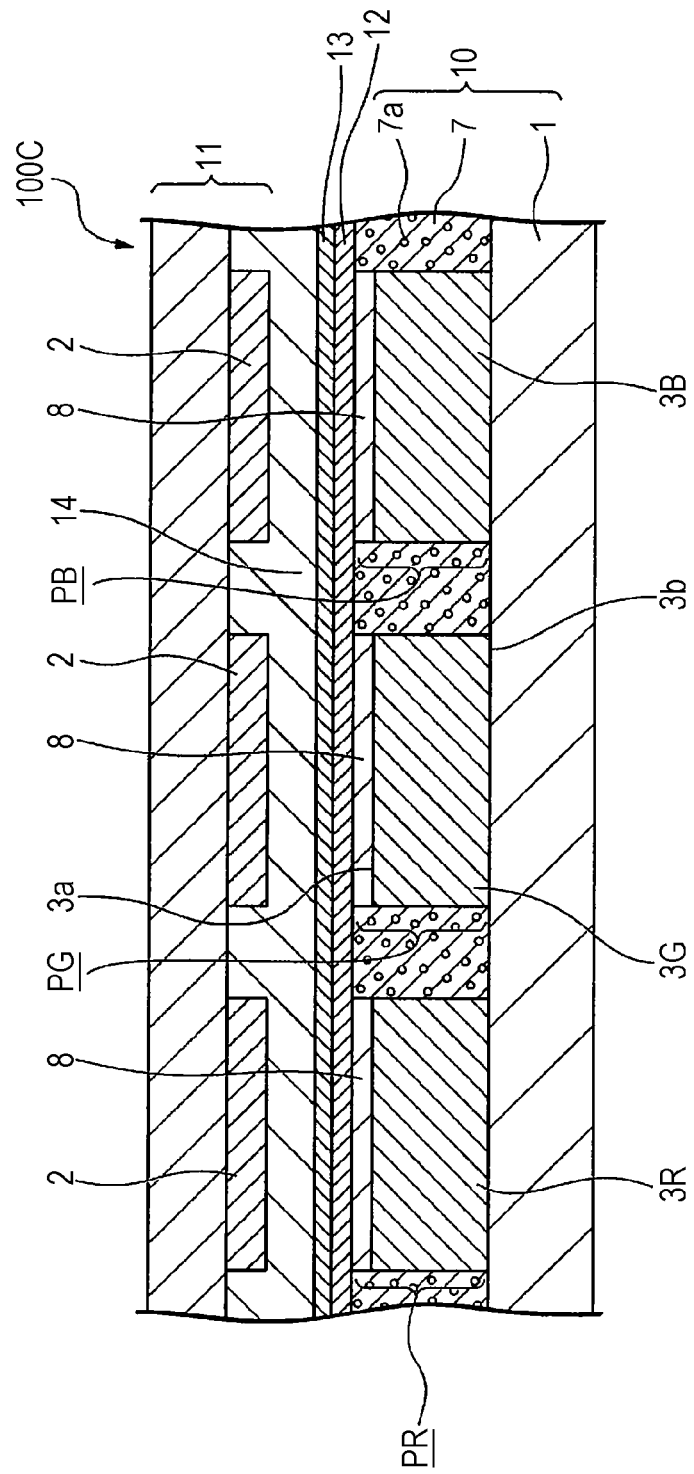
FIG. 13 is a schematic cross-sectional view of a display device according to a fourth embodiment of the present invention.

FIG. 13 is a schematic cross-sectional view of the display device 100C according to the fourth embodiment.

In the display device 100C according to this embodiment, the planarizing layers 8 are disposed on the top faces of the phosphor layers 3R, 3G, and 3B. The band pass filter 12 is disposed on the top faces of the planarizing layers 8 and the partition 7.

The band pass filter 12 has the functions of transmitting light in the blue region (light with a wavelength ranging from 435 nm to 480 nm) and reflecting light in a green to near-infrared region (light outside the wavelength range of the blue region). For example, the band pass filter 12 is formed of a dielectric multilayer film or a thin film composed of gold, silver, or the like. In this case, blue light emitted from the light-emitting elements 2 passes through the band pass filter 12 and is subjected to wavelength conversion in the phosphor layers 3 to emit green light and red light. Furthermore, green light and red light propagating toward the band pass filter 12 are reflected from the band pass filter 12 toward the phosphor layers, so that green light and red light are efficiently used.

In this embodiment, the band pass filter 12 is disposed on the top faces of the planarizing layers 8 but is not limited thereto. For example, a band pass filter may be disposed on the top faces of the phosphor layers 3R, 3G, and 3B in the opening portions of the partition 7 without disposing the planarizing layers 8. In other words, the band pass filter may be disposed between the light-emitting elements 2 and the phosphor substrate 10.

[Fifth Embodiment]

Figure 14:
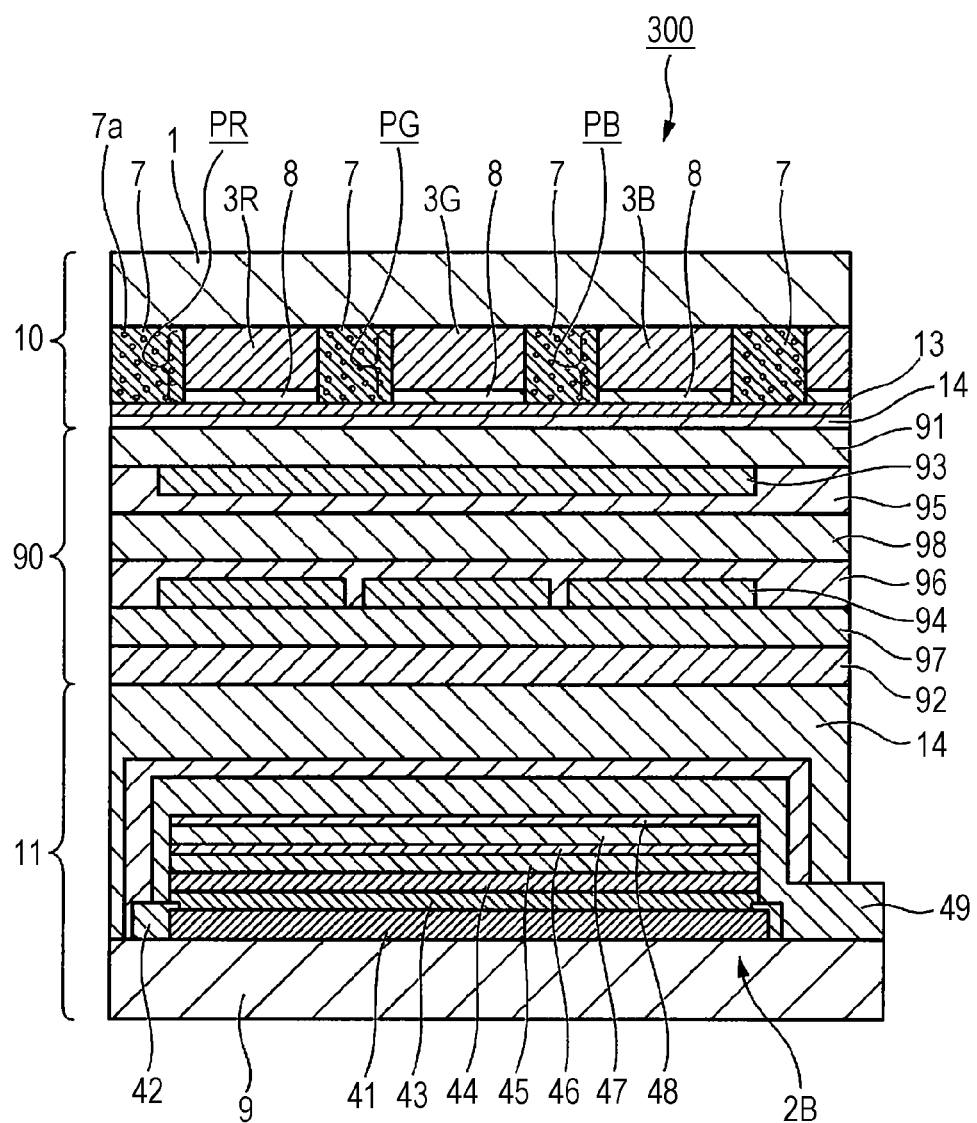
FIG. 14 is a schematic cross-sectional view of a display device according to a fifth embodiment of the present invention.

FIG. 14 is a schematic cross-sectional view of a display device 300 according to a fifth embodiment. The display device 300 has an exemplary structure in which a liquid crystal element 90 serving as an optical member is disposed between the phosphor substrate 10 and the light source 11. In FIG. 14, components common to those of the display device 100 according to the first embodiment are designated using the same reference numerals, and detailed descriptions are not repeated.

The display device 300 according to this embodiment includes the phosphor substrate 10, the organic EL element substrate 11 (light source), and the liquid crystal element 90. The phosphor substrate 10 has the same structure as in the first embodiment.

The laminated structure of the organic EL element substrate 11 is the same as that illustrated in FIG. 5 in the first embodiment. In the first embodiment, however, a driving signal is individually supplied to each of the organic EL elements corresponding to the respective pixels, so that the emission and non-emission of the organic EL elements are independently controlled. In contrast, in this embodiment, the organic EL element 2B is not divided in response to the pixels and functions as a surface light source common to all pixels. The liquid crystal element 90 has a structure such that a voltage applied to a liquid crystal layer 98 can be controlled for each pixel using a pair of electrodes 93 and 94, so that the transmittance of light emitted from the entire surface of the organic EL element 2B is controlled for each pixel. In other words, the liquid crystal element 90 functions as an optical shutter that selectively transmits light from the organic EL element substrate 11 for each pixel.

A known liquid crystal element may be used as the liquid crystal element 90 according to this embodiment. For example, the liquid crystal element 90 includes a pair of polarizers 91 and 92, the electrodes 93 and 94, alignment layers 95 and 96, and a substrate 97. The liquid crystal layer 98 is held between the alignment layers 95 and 96. In some cases, a single optically anisotropic layer is disposed between the liquid crystal cell and one of the polarizers 91 and 92. Alternatively, two optically anisotropic layers are disposed between the liquid crystal cell and each of the polarizers 91 and 92, in some cases. The type of liquid crystal cell is not particularly limited and may be appropriately selected, depending on the purpose. Examples thereof include a TN mode, a VA mode, an OCB mode, an IPS mode, and an ECB mode. The liquid crystal element 90 may operate in a passive matrix addressing mode or in an active matrix addressing mode that uses switching elements, such as TFTs.

The phosphor substrate 10, the liquid crystal element 90, and the light source 11 are bonded and unified using the adhesive layers 14. Specifically, a surface of the phosphor substrate 10 on which the phosphor layers 3R, 3G, and 3B are disposed is bonded to the polarizer 91 of the liquid crystal element 90 with the adhesive layer 14. A surface of the light source 11 on which the organic EL element 2B is disposed is bonded to the polarizer 92 of the liquid crystal element 90 with the adhesive layer 14.

At least one of the polarizers 91 and 92 preferably has an extinction ratio of 10,000 or more in the wavelength range of 435 nm or more and 480 nm or less. The extinction ratio may be measured by, for example, by rotating-analyzer ellipsometry using a Glan-Thompson prism. The term "extinction ratio" is expressed as an inherent property of each of the polarizers 91 and 92 and is defined as follows:

Extinction ratio=(polarized light transmittance in polarization axis of polarizer)/(polarized light transmittance in absorption axis of polarizer)

The term "polarized light transmittance" refers to a transmittance when ideal polarized light is incident using a Glan-Thompson prism.

A conventional liquid crystal is typically designed so as to optimize the contrast and the transmittance mainly in a 550 nm region. An iodine-based polarizer used in a conventional liquid crystal has an extinction ratio of about 2000 to 3000 in a short wavelength region of 490 nm or less (an extinction ratio of about 10000 in a green region and a red region). In contrast, the polarizer for a blue light excitation-type display including a blue-light-emitting backlight according to this embodiment can be optimally designed for a blue region. Thus, a polarizer having an extinction ratio of 10000 or more in the blue region is used.

As described above, the use of the polarizer having a high extinction ratio results in an increase in the contrast of a panel. Furthermore, the polarizer with a high extinction ratio has a high transmittance, thus resulting in an increase in the use efficiency of light from the backlight and a reduction in power consumption.

[Examples of Electronic Apparatus]

Figure 15A:
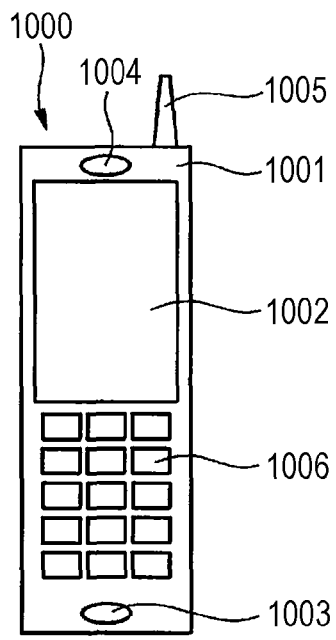
FIG. 15A is a schematic diagram of an example of an electronic apparatus.
Figure 15B:
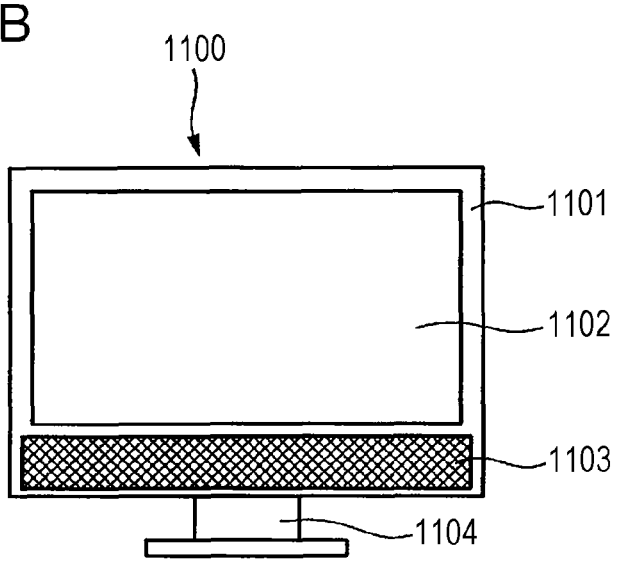
FIG. 15B is a schematic diagram of an example of an electronic apparatus.

Examples of an electronic apparatus including the display device according to the foregoing embodiment include a cellular phone illustrated in FIG. 15A and a television set illustrated in FIG. 15B.

A cellular phone 1000 illustrated in FIG. 15A includes a main body 1001, a display unit 1002, a voice input unit 1003, a voice output unit 1004, an antenna 1005, operating switches 1006, and so forth. The display device according to the foregoing embodiment is used in the display unit 1002.

A television set 1100 illustrated in FIG. 15B includes a main cabinet 1101, a display unit 1102, a speaker 1103, a stand 1104, and so forth. The display device according to the foregoing embodiment is used in the display unit 1002.

In these electronic apparatuses, the display device according to the foregoing embodiment is used, thus providing the electronic apparatuses having excellent display quality with low power consumption.

Figure 16A:
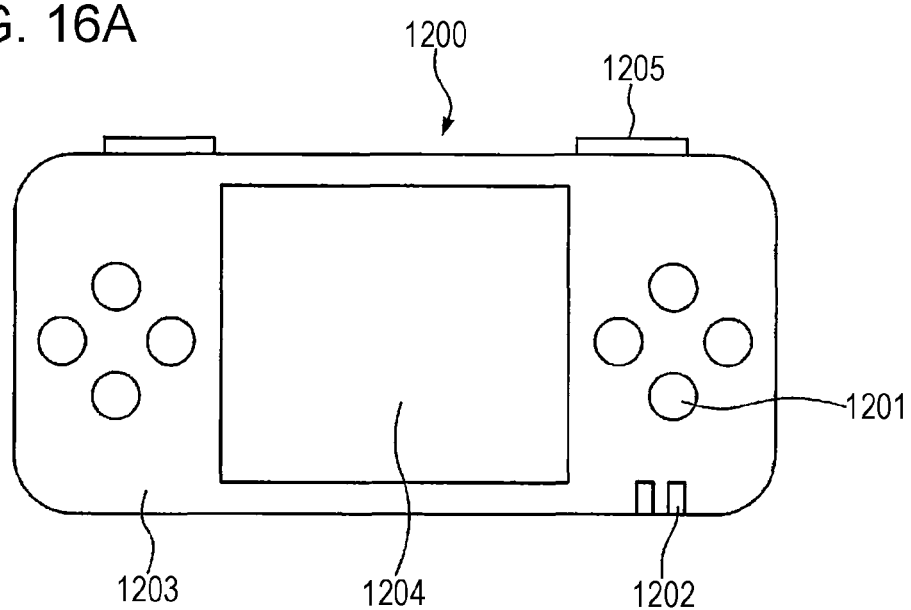
FIG. 16A is a schematic diagram of an example of an electronic apparatus.

A display device according to an embodiment of the present invention may be used for, for example, a handheld gaming machine illustrated in FIG. 16A. A handheld gaming machine 1200 illustrated in FIG. 16A includes operating buttons 1201, LED lamps 1202, a housing 1203, a display unit 1204, an infrared port 1205, and so forth. The display device according to the foregoing embodiment may be suitably used as the display unit 1204. The use of the display device according to an embodiment of the present invention as the display unit 1204 of the handheld gaming machine 1200 enables a high-contrast image to be displayed with low power consumption.

Figure 16B:
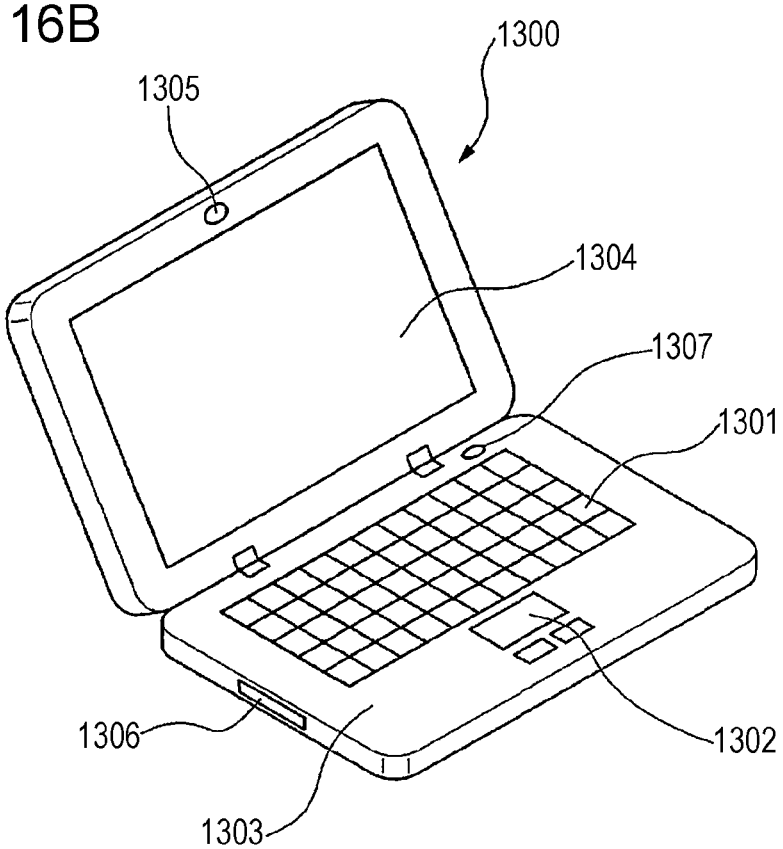
FIG. 16B is a schematic diagram of an example of an electronic apparatus.

A display device according to an embodiment of the present invention may be used for, for example, a notebook personal computer illustrated in FIG. 16B. A notebook personal computer 1300 illustrated in FIG. 16B includes a keyboard 1301, a pointing device 1302, a housing 1303, a display unit 1304, a camera 1305, an external connection port 1306, a power switch 1307, and so forth. The display device according to the foregoing embodiment may be suitably used as the display unit 1304 of the notebook personal computer 1300. The use of the display device according to an embodiment of the present invention as the display unit 1304 of the notebook personal computer 1300 provides the notebook personal computer 1300 capable of displaying a high-contrast image with low power consumption.

Figure 17A:
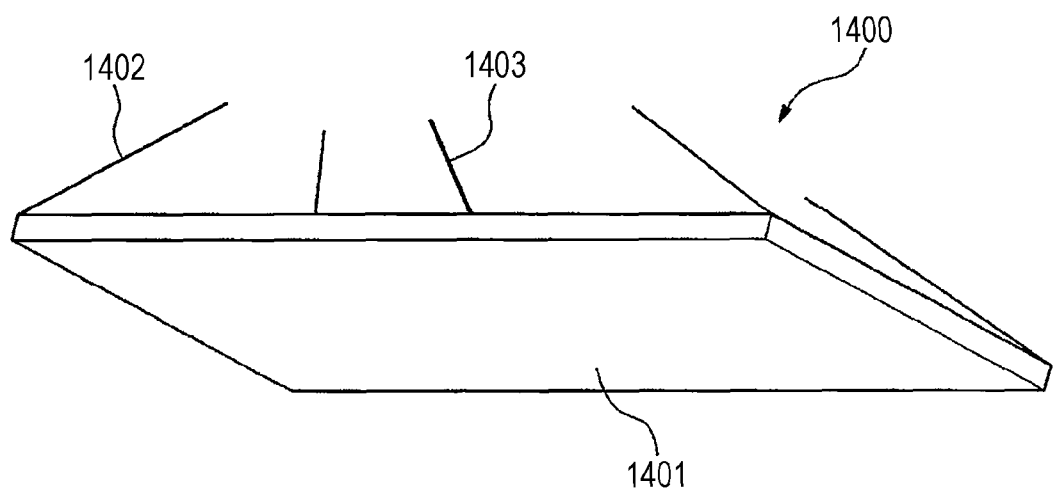
FIG. 17A is a schematic diagram of an example of an electronic apparatus.

A display device according to an embodiment of the present invention may be used for, for example, a ceiling light illustrated in FIG. 17A. A ceiling light 1400 illustrated in FIG. 17A includes an illumination unit 1401, hangers 1402, a power code 1403, and so forth. The display device according to the foregoing embodiment may be suitably used as the illumination unit 1401. The use of a display device according to an embodiment of the present invention as the illumination unit 1401 of the ceiling light 1400 results in illumination light having a freely-selected color tone with low power consumption and provides a luminaire having high light rendering properties. Furthermore, it is possible to provide a luminaire that achieves surface emission with uniform illuminance and high color purity.

Figure 17B:
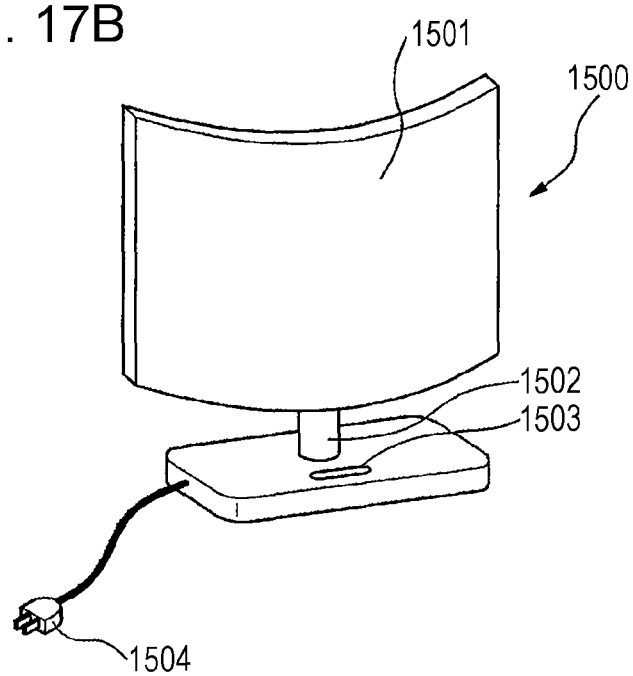
FIG. 17B is a schematic diagram of an example of an electronic apparatus.

A display device according to an embodiment of the present invention may be used for, for example, an illumination stand illustrated in FIG. 17B. An illumination stand 1500 illustrated in FIG. 17B includes an illumination unit 1501, a stand 1502, a power switch 1503, a power code 1504, and so forth. The display device according to the present invention may be suitably used as the illumination unit 1501. The use of a display device according to an embodiment of the present invention as the illumination unit 1501 of the illumination stand 1500 results in illumination light having a freely-selected color tone with low power consumption and provides a luminaire having high light rendering properties. Furthermore, it is possible to provide a luminaire that achieves surface emission with uniform illuminance and high color purity.

EXAMPLES

While embodiments of the present invention will be described in more detail below by examples and comparative examples, the embodiments of the present invention are not limited to these examples.

Comparative Example 1

Figure 18A:
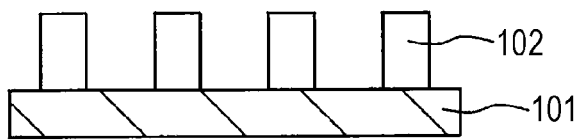
FIG. 18A is a schematic diagram illustrating a comparative example.

As illustrated in FIG. 18A, a 0.7-mm-thick substrate 101 composed of glass was used. The substrate 101 was subjected to washing with water, ultrasonic cleaning with pure water for 10 minutes, ultrasonic cleaning with acetone for 10 minutes, and steam cleaning with isopropyl alcohol for 5 minutes, followed by drying at 100° C. for 1 hour.

A pattern of a photoresist containing a metal, e.g., Cr (chromium) or a multilayer film of Cr/oxide of Cr, or carbon particles dispersed in a photosensitive resin was formed on the substrate 101, the pattern having a pixel pitch of 500 μm and a line width of 50 μm. Thereby, a black matrix 102 having a thickness of 50 μm was formed to partition dots.

Figure 18B:
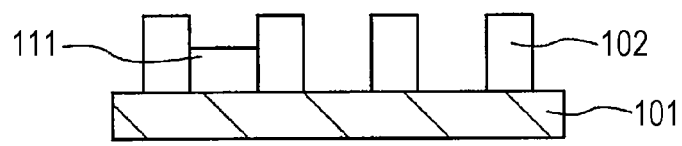
FIG. 18B is a schematic diagram illustrating a comparative example.
Figure 18C:
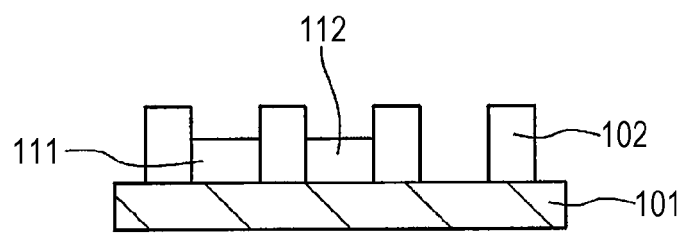
FIG. 18C is a schematic diagram illustrating a comparative example.
Figure 18D:
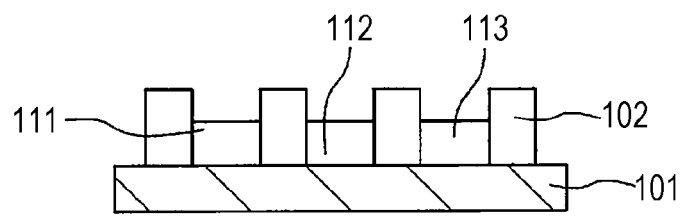
FIG. 18D is a schematic diagram illustrating a comparative example.

As illustrated in FIGS. 18B to 18D, a pattern of a red phosphor layer 111, a green phosphor layer 112, and a blue-light-scattering layer 113 was formed in regions defined by the black matrix 102.

In a step of forming the red phosphor layer 111, 30 g of 10% by weight of an aqueous solution of polyvinyl alcohol was added to 20 g of a red phosphor CaS:Eu with an average particle size of 4 μm. The resulting mixture was stirred with a disperser to prepare a coating liquid for the formation of a red phosphor.

The resulting coating liquid for the formation of a red phosphor was applied by a dispenser method to the regions defined by the black matrix 102 to form a pattern. Subsequently, the pattern was dried by heating for 4 hours with a vacuum oven (conditions: 200° C., 10 mmHg) to form a pattern of the red phosphor layers 111 each having a thickness of 25 μm and a refractive index of 1.6 (FIG. 18B).

In a step of forming the green phosphor layer 112, 30 g of 10% by weight of an aqueous solution of polyvinyl alcohol was added to 20 g of a green phosphor $Ga_2SrS_4$:Eu with an average particle size of 4 μm. The resulting mixture was stirred with a disperser to prepare a coating liquid for the formation of a green phosphor.

The resulting coating liquid for the formation of a green phosphor was applied by a dispenser method to the regions defined by the black matrix 102 to form a pattern. Subsequently, the pattern was dried by heating for 4 hours with a vacuum oven (conditions: 200° C., 10 mmHg) to form a pattern of the green phosphor layers 112 each having a thickness of 25 μm and a refractive index of 1.6 (FIG. 18C).

In a step of forming the blue-light-scattering layer 113, 30 g of 10% by weight of an aqueous solution of polyvinyl alcohol was added to 20 g of silica particles 1.5 μm in size (refractive index: 1.65). The resulting mixture was stirred with a disperser to prepare a coating liquid for the formation of a blue-light-scattering layer.

The resulting a coating liquid for the formation of a blue-light-scattering layer was applied by a dispenser method to the regions defined by the black matrix 102 to form a pattern. Subsequently, the pattern was dried by heating for 4 hours with a vacuum oven (conditions: 200° C., 10 mmHg) to form the blue-light-scattering layer 113 having a refractive index of 1.6 and a thickness of 50 μm (FIG. 18D).

Thereby, a phosphor substrate was completed.

The light-output efficiency was measured at the front of the phosphor substrate with a total luminous flux measurement system (HalfMoon, available from Otsuka Electronics Co., Ltd.) by irradiating the back of the phosphor substrate with excitation light having a wavelength of 460 nm. The results demonstrated that the light-output efficiency was 43%.

Comparative Example 2

The black matrix (partition) 102 was formed on the substrate 101 in the same method as in Comparative Example 1. A pattern of the red phosphor layer 111, the green phosphor layer 112, and the blue-light-scattering layer 113 was formed in regions defined by the black matrix 102.

In a step of forming the red phosphor layer 111, 100 g of a toluene solution of 10% by weight of polystyrene was added to 0.05 g of Lumogen Red F305. The resulting mixture was heated under stirring to prepare a coating liquid for the formation of a red phosphor.

The resulting coating liquid for the formation of a red phosphor was applied by a dispenser method to the regions defined by the black matrix 102 to form a pattern. Subsequently, the pattern was dried by heating for 4 hours with a vacuum oven (conditions: 200° C., 10 mmHg) to form a pattern of the red phosphor layers (FIG. 18B).

In a step of forming the green phosphor layer 112, 100 g of a toluene solution of 10% by weight of polystyrene was added to 0.05 g of Lumogen Yellow F083. The resulting mixture was heated under stirring to prepare a coating liquid for the formation of a green phosphor.

The resulting coating liquid for the formation of a green phosphor was applied by a dispenser method to the regions defined by the black matrix 102 to form a pattern. Subsequently, the pattern was dried by heating for 4 hours with a vacuum oven (conditions: 200° C., 10 mmHg) to form a pattern of the green phosphor layers (FIG. 18C).

In a step of forming the blue-light-scattering layer 113, 5 g of titanium oxide which serves as light-scattering particles and which had an average particle size of 200 nm was added to 30 g of a resin (LuxPrint 8155, manufactured by Teijin DuPont) serving as a binder resin. Furthermore, 10 g of hollow silica having a refractive index of 1.21 and a particle size of 20 nm was added thereto. The mixture was well stirred for 30 minutes with an automatic mortar and then stirred for 15 minutes with a dispersing and mixing apparatus (FILMIX 40-40, manufactured by PRIMIX Corporation) to prepare a coating liquid for the formation of a blue-light-scattering layer.

The coating liquid for the formation of a blue-light-scattering layer was applied by a dispenser method to the regions defined by the black matrix 102 to form a pattern. Subsequently, the pattern was dried by heating for 4 hours with a vacuum oven (conditions: 200° C., 10 mmHg) to form a pattern of the blue-light-scattering layers 113 (FIG. 18D).

Thereby, a phosphor substrate was completed.

The light-output efficiency was measured at the front surface of the phosphor substrate with a total luminous flux measurement system (HalfMoon, available from Otsuka Electronics Co., Ltd.) by irradiating the back of the phosphor substrate with excitation light having a wavelength of 460 nm. The results demonstrated that the light-output efficiency was 42%.

Example 1

Figure 19A:
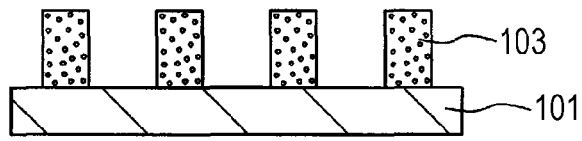
FIG. 19A is a schematic cross-sectional view illustrating a production method in Example 1.

As illustrated in FIG. 19A, as with Comparative Example 1, the 0.7-mm-thick substrate 101 composed of glass was used. The substrate 101 was subjected to washing with water, ultrasonic cleaning with pure water for 10 minutes, ultrasonic cleaning with acetone for 10 minutes, and steam cleaning with isopropyl alcohol for 5 minutes, followed by drying at 100° C. for 1 hour.

With respect to a material for a partition 103, an epoxy-based resin (refractive index: 1.59), an acrylic-based resin (refractive index: 1.49), rutile-type titanium oxide (refractive index: 2.71, particle size: 250 nm), a photoinitiator, and an aromatic solvent were mixed together. The resulting mixture was stirred to prepare a white photosensitive composition serving as a negative resist.

The negative resist was applied on the substrate 101 with a spin coater and then pre-baked at 80° C. for 10 minutes to form a coating film with a thickness of 50 μm. The coating film was covered with a mask (pixel pitch: 500 μm, line width: 50 μm) configured to form a desired image pattern and irradiated with the i-line (300 mJ/cm$^2$) to perform exposure. Then the film was developed with an alkaline developer to form a pixel pattern-like structure. Subsequently, the resulting structure was post-baked at 140° C. for 60 minutes with a hot air circulation-type drying oven to form the partition 103 to define dots. The reflectance of the partition 103 was measured and found to be 96.5%.

Figure 19B:
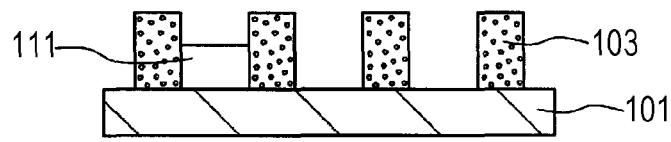
FIG. 19B is a schematic cross-sectional view illustrating the production method in Example 1.
Figure 19C:
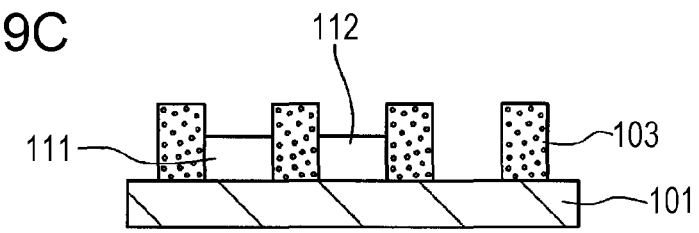
FIG. 19C is a schematic cross-sectional view illustrating the production method in Example 1.
Figure 19D:
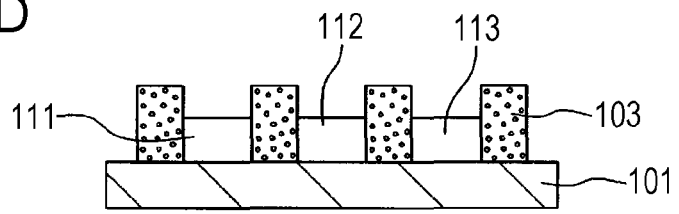
FIG. 19D is a schematic cross-sectional view illustrating the production method in Example 1.

As illustrated in FIGS. 19B to 19D, a pattern of the red phosphor layer 111, the green phosphor layer 112, and the blue-light-scattering layer 113 was formed in regions defined by the partition 103, in the same way as in Comparative Example 1.

Thereby, a phosphor substrate was completed.

The light-output efficiency was measured at the front of the phosphor substrate with a total luminous flux measurement system (HalfMoon, available from Otsuka Electronics Co., Ltd.) by irradiating the back of the phosphor substrate with excitation light having a wavelength of 460 nm. The results demonstrated that the light-output efficiency was 67%, which indicated that the value of the light-output efficiency was 1.56 times better than that in Comparative Example 1.

Example 2

Figure 20A:
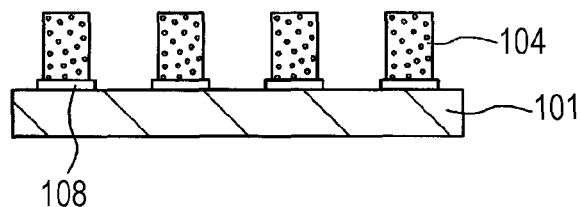
FIG. 20A is a schematic cross-sectional view illustrating a production method in Example 2.

As illustrated in FIG. 20A, as with Comparative Example 1, the 0.7-mm-thick substrate 101 composed of glass was used. The substrate 101 was subjected to washing with water, ultrasonic cleaning with pure water for 10 minutes, ultrasonic cleaning with acetone for 10 minutes, and steam cleaning with isopropyl alcohol for 5 minutes, followed by drying at 100° C. for 1 hour.

A BK resist serving as a black matrix material, manufactured by Tokyo Ohka Kogyo Co., Ltd., was applied thereon with a spin coater and then pre-baked at 70° C. for 15 minutes to form a coating film with a thickness of 1 µm. The coating film was covered with a mask (pixel pitch: 500 µm, line width: 50 µm) configured to form a desired image pattern and irradiated with the i-line (100 mJ/cm$^2$) to perform exposure. Then the film was developed with an aqueous solution of sodium carbonate, serving as a developer, and subjected to rinse treatment with deionized water to form a pixel pattern-like structure. Subsequently, the negative resist serving as the white partition material described in Example 1 was applied thereon with a spin coater and then pre-baked at 70° C. for 15 minutes to form a coating film with a thickness of 30 µm. The coating film was covered with a mask (pixel pitch: 500 µm, line width: 50 µm) configured to form a desired image pattern and irradiated with the i-line (300 mJ/cm$^2$) to perform exposure, while being aligned with the black matrix which has been formed as an underlying layer.

Then the film was developed with an aqueous solution of sodium carbonate, serving as a developer, and subjected to rinse treatment with deionized water to form a pixel pattern-like structure. Subsequently, the resulting structure was post-baked at 140° C. for 60 minutes with a hot air circulation-type drying oven to form a 30-µm-thick partition 104 to define dots. The reflectance of the partition 104 was measured and found to be 89.6%.

Figure 20B:
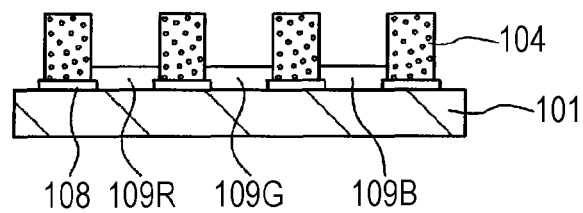
FIG. 20B is a schematic cross-sectional view illustrating the production method in Example 2.

As illustrated in FIG. 20B, a red color filter 109R, a green color filter 109G, and a blue color filter 109B were formed by an ink-jet method in regions defined by the resulting partition, each of the filters having a thickness of 1 µm.

Figure 20C:
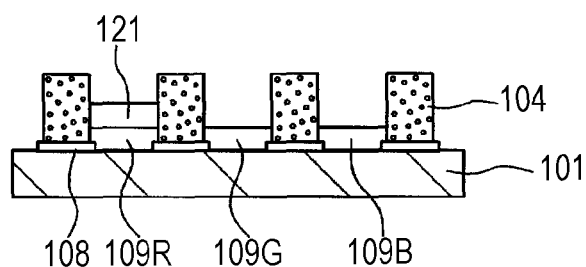
FIG. 20C is a schematic cross-sectional view illustrating the production method in Example 2.
Figure 20D:
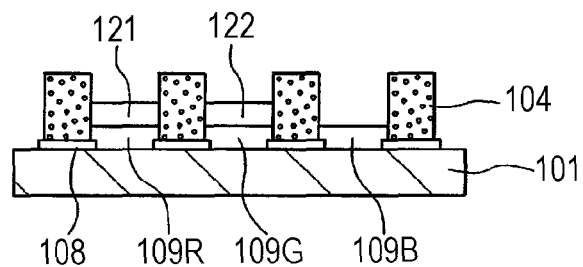
FIG. 20D is a schematic cross-sectional view illustrating the production method in Example 2.
Figure 20E:
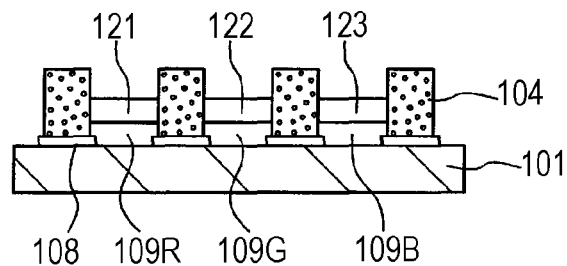
FIG. 20E is a schematic cross-sectional view illustrating the production method in Example 2.

As illustrated in FIGS. 20C to 20E, a pattern of a red phosphor layer 121, a green phosphor layer 122, and a blue-light-scattering layer 123 was formed in the regions defined by the partition 104, in the same way as in Comparative Example 1.

Figure 20F:
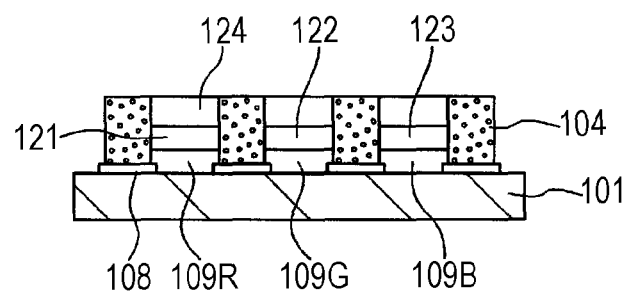
FIG. 20F is a schematic cross-sectional view illustrating the production method in Example 2.

To minimize variations in surface height in a phosphor substrate to be formed, an acrylic resin was applied by a spin coating method on the entire surface of the substrate 101 so as to form a film with a thickness of 20 µm. Subsequently, the resulting acrylic resin film was heated at 120° C. for 30 minutes to form a planarizing layer 124 (FIG. 20F).

Figure 20G:
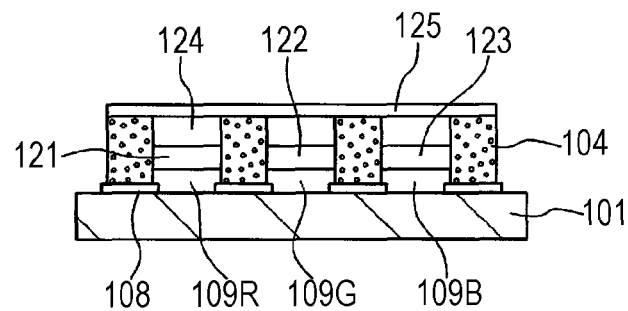
FIG. 20G is a schematic cross-sectional view illustrating the production method in Example 2.

To improve the light-output efficiency, a band pass filter 125 having a transmittance of light with a wavelength of 460 nm of 85% and a transmittance of visible light with a wavelength of 480 nm or more of 5% or less was bonded to the planarizing layer 124 with a thermosetting transparent elastomer (see FIG. 20G).

Thereby, a phosphor layer was completed.

The light-output efficiency was measured at the front of the phosphor substrate with a total luminous flux measurement system (HalfMoon, available from Otsuka Electronics Co., Ltd.) by irradiating the back of the phosphor substrate with excitation light having a wavelength of 460 nm. The results demonstrated that the light-output efficiency was 65%, which indicated that the value of the light-output efficiency was 1.51 times better than that in Comparative Example 1.

Example 3

Blue LED+Phosphor Method

Figure 21:
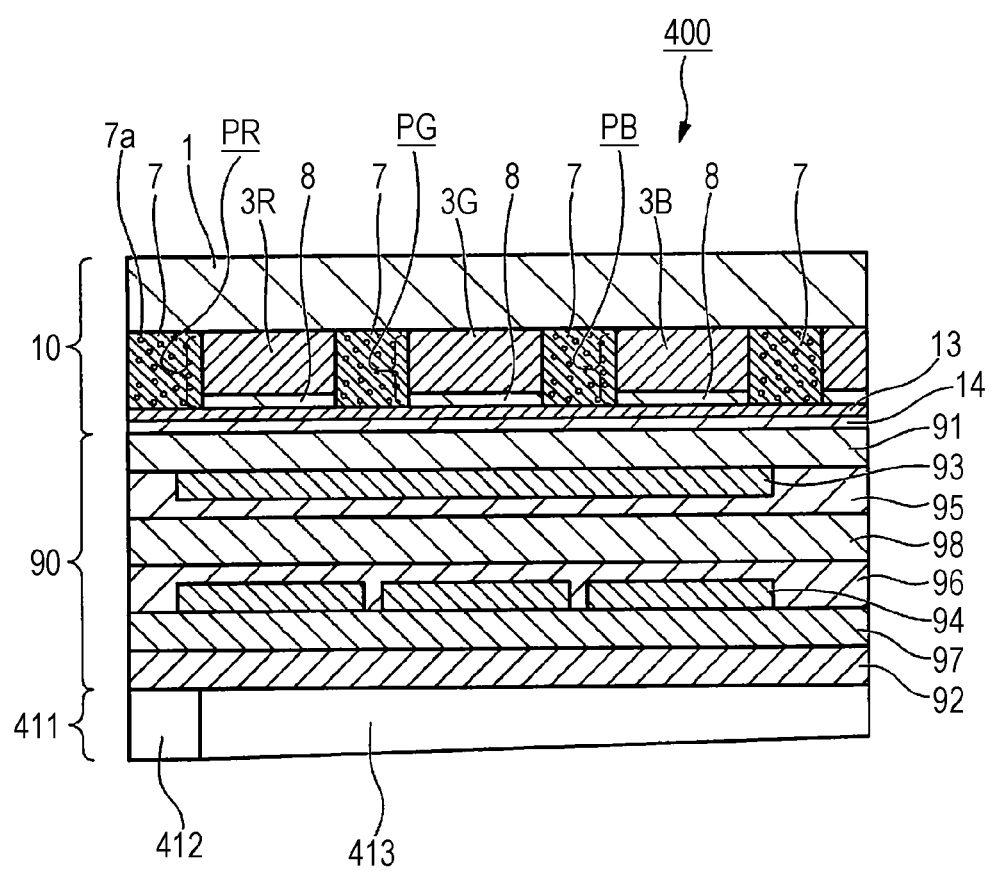
FIG. 21 is a schematic cross-sectional view illustrating a production method in Example 3.

FIG. 21 is a schematic cross-sectional view of a display device 400 according to Example 3. The display device 400 according to this example includes the phosphor substrate 10, an LED backlight 411, and the liquid crystal element 90.

The LED backlight 411 includes an LED excitation light source 412 and a light guide plate 413.

A liquid crystal panel including a first polarizer, a first substrate, a liquid crystal layer held between a pair of transparent electrodes, a protective film, and a second polarizer was formed on a blue LED surface light source (peak wavelength: 450 nm) having directivity whose half-width was 10°. Each of the first polarizer and the second polarizer had an extinction ratio of 12,000 at a wavelength of 435 nm or more and 480 nm or less. The liquid crystal was driven by an active matrix addressing method using TFTs. A band pass filter which transmits light in a blue region and reflects light in a green to near-infrared region was bonded to a second substrate with a thermosetting transparent elastomer. Furthermore, a phosphor substrate produced by the method according to Example 2 was bonded to this substrate. Thereby, a full-color display was achieved, and a good image and an image having good viewing angle characteristics were achieved.

Example 4

Figure 22A:
FIG. 22A is a schematic cross-sectional view illustrating a production method in Example 4.

As illustrated in FIG. 22A, as with Comparative Example 1, the 0.7-mm-thick substrate 101 composed of glass was used. The substrate 101 was subjected to washing with water, ultrasonic cleaning with pure water for 10 minutes, ultrasonic cleaning with acetone for 10 minutes, and steam cleaning with isopropyl alcohol for 5 minutes, followed by drying at 100° C. for 1 hour.

Figure 22B:
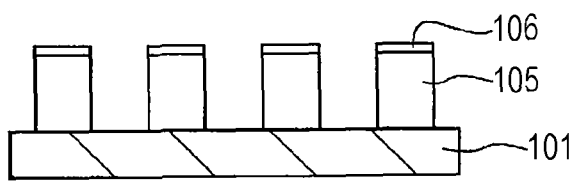
FIG. 22B is a schematic cross-sectional view illustrating the production method in Example 4.
Figure 22C:
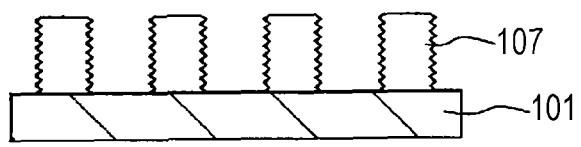
FIG. 22C is a schematic cross-sectional view illustrating the production method in Example 4.

A glass paste 105 was applied on the substrate 101 with an applicator so as to form a film with a thickness of 30 µm, and then dried. A dry film resist (NB-235, manufactured by Tokyo Ohka Kogyo Co., Ltd.) was laminated over the dry glass paste 105 and subjected to exposure with a photomask. Spray development was performed with an aqueous solution of sodium carbonate, thereby forming a blast-resistant pattern 106 (FIG. 22B). Next, blasting was performed from a direction perpendicular to the dry glass paste 105 with the blast-resistant pattern 106 by a sandblasting method using S-9#1200 (stainless steel abrasive, manufactured by Fuji Manufacturing Co., Ltd.) as an abrasive. The blast-resistant pattern was detached with an aqueous solution of sodium hydroxide. Firing was performed at a peak temperature of 550° C. for a holding time of 13 minutes and a total firing time of 2 hours. In this way, a partition 107 with side faces each having an uneven microstructure whose peak-to-peak distance was about 500 nm was formed (FIG. 22C). In this case, the partition had a thickness of 30 µm. The reflectance of the partition 107 was measured and found to be 91%.

Figure 22D:
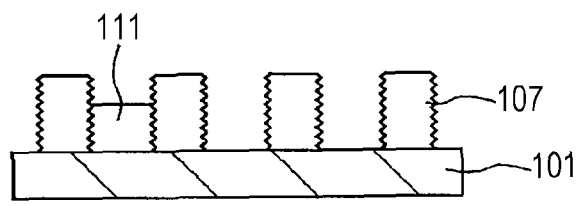
FIG. 22D is a schematic cross-sectional view illustrating the production method in Example 4.
Figure 22E:
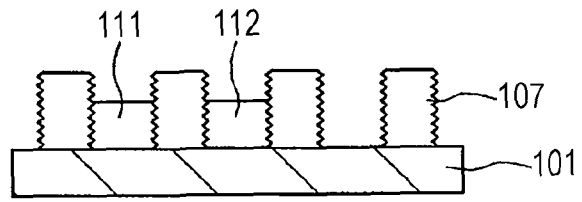
FIG. 22E is a schematic cross-sectional view illustrating the production method in Example 4.
Figure 22F:
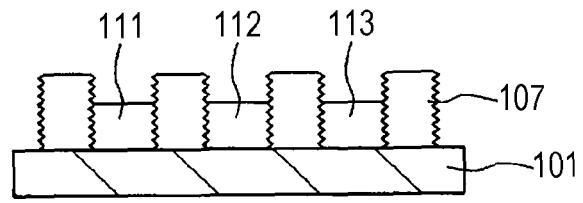
FIG. 22F is a schematic cross-sectional view illustrating the production method in Example 4.

As illustrated in FIGS. 22D to 22F, a pattern of the red phosphor layer 111, the green phosphor layer 112, and the blue-light-scattering layer 113 was formed in regions defined by the partition 107, in the same way as in Comparative Example 1.

Thereby, a phosphor substrate was completed.

The light-output efficiency was measured at the front of the phosphor substrate with a total luminous flux measurement system (HalfMoon, available from Otsuka Electronics Co., Ltd.) by irradiating the back of the phosphor substrate with excitation light having a wavelength of 460 nm. The results demonstrated that the light-output efficiency was 67%, which indicated that the value of the light-output efficiency was 1.56 times better than that in Comparative Example 1.

Example 5

As illustrated in FIG. 19A, as with Example 1, the 0.7-mm-thick substrate 101 composed of glass was used. The substrate 101 was subjected to washing with water, ultrasonic cleaning with pure water for 10 minutes, ultrasonic cleaning with acetone for 10 minutes, and steam cleaning with isopropyl alcohol for 5 minutes, followed by drying at 100° C. for 1 hour.

With respect to a material for the partition 103, an epoxy-based resin (refractive index: 1.59), an acrylic-based resin (refractive index: 1.49), rutile-type titanium oxide (refractive index: 2.71, particle size: 250 nm), a photoinitiator, and an aromatic solvent were mixed together. The resulting mixture was stirred to prepare a white photosensitive composition serving as a negative resist.

The negative resist was applied on the substrate 101 with a spin coater and then pre-baked at 80° C. for 10 minutes to form a coating film with a thickness of 50 µm. The coating film was covered with a mask (pixel pitch: 500 µm, line width: 50 µm) configured to form a desired image pattern and irradiated with the i-line (300 mJ/cm$^2$) to perform exposure. Then the film was developed with an alkaline developer to form a pixel pattern-like structure. Subsequently, the resulting structure was post-baked at 140° C. for 60 minutes with a hot air circulation-type drying oven to form the partition 103 to define dots. The reflectance of the partition 103 was measured and found to be 96.5%.

As illustrated in FIGS. 19B to 19D, a pattern of the red phosphor layer 111, the green phosphor layer 112, and a blue phosphor layer 113 was formed in regions defined by the partition 103, in the same way as in Example 1.

In a step of forming the red phosphor layer 111, 30 g of 10% by weight of an aqueous solution of polyvinyl alcohol was added to 20 g of a red phosphor CaAlSiN$_3$:Eu with an average particle size of 4 µm. The resulting mixture was stirred with a disperser to prepare a coating liquid for the formation of a red phosphor.

The resulting coating liquid for the formation of a red phosphor was applied by a dispenser method to the regions defined by the black matrix 102 to form a pattern. Subsequently, the pattern was dried by heating for 4 hours with a vacuum oven (conditions: 200° C., 10 mmHg) to form a pattern of the red phosphor layers 111 each having a thickness of 25 µm and a refractive index of 1.6 (FIG. 19B).

In a step of forming the green phosphor layer 112, 30 g of 10% by weight of an aqueous solution of polyvinyl alcohol was added to 20 g of a green phosphor SrGa$_2$S$_4$:Eu with an average particle size of 4 µm. The resulting mixture was stirred with a disperser to prepare a coating liquid for the formation of a green phosphor.

The resulting coating liquid for the formation of a green phosphor was applied by a dispenser method to the regions defined by the black matrix 102 to form a pattern. Subsequently, the pattern was dried by heating for 4 hours with a vacuum oven (conditions: 200° C., 10 mmHg) to form a pattern of the green phosphor layers 112 each having a thickness of 25 µm and a refractive index of 1.6 (FIG. 19C).

In a step of forming the blue phosphor layer 113, 30 g of 10% by weight of an aqueous solution of polyvinyl alcohol was added to 20 g of a blue phosphor layer Sr$_{10}$(PO$_4$)$_6$C$_{12}$:Eu with an average particle size of 4 µm. The resulting mixture was stirred with a disperser to prepare a coating liquid for the formation of a blue phosphor.

The resulting coating liquid for the formation of a blue phosphor was applied by a dispenser method to the regions defined by the partition. Subsequently, the pattern was dried by heating for 4 hours with a vacuum oven (conditions: 200° C., 10 mmHg) to form a pattern of the blue phosphor layers each having a thickness of 25 µm and a refractive index of 1.6 (FIG. 19D).

Thereby, a phosphor substrate was completed.

The light-output efficiency was measured at the front of the phosphor substrate with a total luminous flux measurement system (HalfMoon, available from Otsuka Electronics Co., Ltd.) by irradiating the back of the phosphor substrate with excitation light having a wavelength of 400 nm. The results demonstrated that the light-output efficiency was 64%, which indicated that the value of the light-output efficiency was 1.49 times better than that in Comparative Example 1.

Example 6

The light-scattering partition 103 was formed on the substrate 101 in the same way as in Example 5.

A pattern of the red phosphor layer 111, the green phosphor layer 112, and the blue phosphor layer 113 was formed in regions defined by the partition 103 using the same dispenser method with the coating liquids for the formation of phosphors as in Comparative Example 2.

Thereby, a phosphor substrate was completed.

The light-output efficiency was measured at the front surface of the phosphor substrate with a total luminous flux measurement system (HalfMoon, available from Otsuka Electronics Co., Ltd.) by irradiating the back of the phosphor substrate with excitation light having a wavelength of 460 nm. The results demonstrated that the light-output efficiency was 61%, which indicated that the value of the light-output efficiency was 1.45 times better than that in Comparative Example 2.

Industrial Applicability

Embodiments of the present invention may be used in the field of phosphor substrates, display devices, and electronic apparatuses.

Reference Signs List 1 substrate, 2 light-emitting element, 3R red phosphor layer, 3G green phosphor layer, 3B blue phosphor layer, 4R, 4G, 4B color filter, 5, 6 black layer, 7, 17 partition, 7a light-scattering particles, 9 substrate, 10 phosphor substrate, 11 light source, 12 band pass filter, 13 substrate located opposite substrate, 14 adhesive layer, 51 TFT (active element), 70 organic EL element substrate (light source), 90 liquid crystal element, 91, 92 polarizer, 100, 100A, 200, 300 display device, 1000 cellular phone (electronic apparatus), 1100 television set (electronic apparatus), 1200 handheld gaming machine (electronic apparatus), 1300 notebook personal computer (electronic apparatus), 1400 ceiling light (electronic apparatus), 1500 illumination stand (electronic apparatus), L1 excitation light, L2 fluorescence, PR red pixel, PG green pixel, PB blue pixel

The invention claimed is:

1. A phosphor substrate comprising:
a substrate;
a phosphor layer disposed on the substrate, the phosphor layer emitting fluorescence using incident excitation light; and
a partition surrounding a side face of the phosphor layer,
wherein at least a portion of the partition in contact with the phosphor layer has light-scattering properties, is white, and is composed of a material containing a resin and light-scattering particles, the resin having a first refractive index, the light scattering particles having a second refractive index, the second refractive index being higher than the first refractive index, the light scattering particles being dispersed in the resin, each of the light scattering particles having a particle size of 100 nm to 500 nm.

2. The phosphor substrate according to claim 1, wherein at least the portion of the partition in contact with the phosphor layer has an uneven shape.

3. A display device comprising the phosphor substrate according to claim 1 and a light source configured to emit excitation light with which the phosphor layer is irradiated.

4. The display device according to claim 3,
wherein the phosphor substrate includes a plurality of pixels, the plurality of pixels at least including a red pixel configured to perform display with red light, a green pixel configured to perform display with green light, and a blue pixel configured to perform display with blue light,
ultraviolet light serving as the excitation light is emitted from the light source, and
the phosphor layer includes a red phosphor layer disposed as the red pixel, the red phosphor layer being configured to emit red light using the ultraviolet light as the excitation light, a green phosphor layer disposed as the green pixel, the green phosphor layer being configured to emit green light using the ultraviolet light as the excitation light, and a blue phosphor layer disposed as the blue pixel, the blue phosphor layer being configured to emit blue light using the ultraviolet light as the excitation light.

5. The display device according to claim 3,
wherein the phosphor substrate includes a plurality of pixels, the plurality of pixels at least including a red pixel configured to perform display with red light, a green pixel configured to perform display with green light, and a blue pixel configured to perform display with blue light,
blue light serving as the excitation light is emitted from the light source,
the phosphor layer includes a red phosphor layer disposed as the red pixel, the red phosphor layer being configured to emit red light using the blue light as the excitation light, and a green phosphor layer disposed as the green pixel, the green phosphor layer being configured to emit green light using the blue light as the excitation light, and
the phosphor substrate includes a scattering layer serving as the blue pixel, the scattering layer being configured to scatter the blue light.

6. The display device according to claim 4, wherein the light source is an active matrix addressed light source, the active matrix addressed light source including a plurality of light-emitting elements disposed in response to the plurality of pixels and a plurality of driving elements configured to drive the respective plurality of light-emitting elements.

7. The display device according to claim 5, wherein the light source is an active matrix addressed light source, the active matrix addressed light source including a plurality of light-emitting elements disposed in response to the plurality of pixels and a plurality of driving elements configured to drive the respective plurality of light-emitting elements.

8. The display device according to claim 3, wherein the light source includes a light-emitting diode, an organic electroluminescent element, or an inorganic electroluminescent element.

9. The display device according to claim 3,
wherein the light source is a planar light source configured to emit light from a light-emitting surface, and
a liquid crystal element is disposed between the planar light source and the phosphor substrate, the liquid crystal element being configured to control a transmittance of light emitted from the planar light source for each pixel.

10. The display device according to claim 3, wherein the light source has directivity.

11. The display device according to claim 3, wherein a polarizer is disposed between the light source and the phosphor substrate, the polarizer having an extinction ratio of 10,000 or more at a wavelength of 435 nm or more and 480 nm or less.

12. The display device according to claim 3, wherein a color filter is disposed on any one of a top face and a bottom face of the phosphor layer.

13. The display device according to claim 3, wherein a black layer is disposed on at least one of a top face and a bottom face of the partition.

14. The display device according to claim 3, wherein a band pass filter is disposed between the light source and the phosphor substrate, the band pass filter transmitting light in a blue region and reflecting light in a green to near-infrared region.

15. An electronic apparatus comprising the display device according to claim 3.

16. A display device comprising:
a phosphor substrate, the phosphor substrate comprising:
a substrate;
a phosphor layer disposed on the substrate, the phosphor layer emitting fluorescence using ultraviolet light or blue light;
a partition surrounding a side face of the phosphor layer; and
a black layer disposed on at least one of a top face and a bottom face of the partition,
wherein the phosphor layer includes at least one of a red phosphor layer and a green phosphor layer,
the red phosphor layer emits red light by being excited by the ultraviolet light or blue light,
the green phosphor layer emits green light by being excited by the ultraviolet light or blue light,
at least a portion of the partition in contact with the phosphor layer has light-scattering properties, is white, and is composed of a material containing a resin and light-scattering particles, the resin having a first refractive index, the light scattering particles having a second refractive index, the second refractive index being higher than the first refractive index, the light scattering particles being dispersed in the resin, each of the light scattering particles having a particle size of 100 nm to 500 nm, and the partition has a tapered shape, and a light source configured to emit the ultraviolet light or blue light toward the phosphor layer, wherein the light source includes a light-emitting diode, an organic electroluminescent element, or an inorganic electroluminescent element.

17. The display device according to claim 16, wherein a ratio of the height of the partition to the breadth of a portion of the partition which contacts the substrate is 1 or less.

18. The display device according to claim 17, wherein the phosphor substrate further includes a blue pixel, the blue pixel including a scattering layer, the scattering layer including light scattering particles, and the light scattering particles included in the at least the portion of the partition in contact with the phosphor layer and the light scattering particles included in the scattering layer are made of same material.

19. The phosphor substrate according to claim 1, wherein the light scattering particles are composed of an inorganic material.

20. The phosphor substrate according to claim 3, wherein the light source is configured to emit one of first light and second light, a first main emission peak of the first light being at 360 nm to 410 nm, a second main emission peak of the second light being at 410 nm to 480 nm.

* * * * *